United States Patent
Yamazaki et al.

(10) Patent No.: US 9,938,197 B2
(45) Date of Patent: Apr. 10, 2018

(54) UNLEADED PIEZOELECTRIC CERAMIC COMPOSITION, PIEZOELECTRIC ELEMENT USING SAME, DEVICE, AND METHOD FOR MANUFACTURING UNLEADED PIEZOELECTRIC CERAMIC COMPOSITION

(71) Applicant: NGK SPARK PLUG CO., LTD., Nagoya-shi, Aichi (JP)

(72) Inventors: Masato Yamazaki, Komaki (JP); Takayuki Matsuoka, Aichi-ken (JP); Kazuaki Kitamura, Ise (JP); Hisashi Kozuka, Ichinomiya (JP); Hideto Yamada, Komaki (JP); Toshiaki Kurahashi, Konan (JP); Yasuyuki Okimura, Inuyama (JP); Kazushige Ohbayashi, Nagoya (JP); Takashi Kasashima, Ichinomiya (JP)

(73) Assignee: NGK SPARK PLUG CO., LTD., Aichi (JP)

( * ) Notice: Subject to any disclaimer, the term of this patent is extended or adjusted under 35 U.S.C. 154(b) by 384 days.

(21) Appl. No.: 14/780,235

(22) PCT Filed: Mar. 11, 2014

(86) PCT No.: PCT/JP2014/001358
§ 371 (c)(1),
(2) Date: Sep. 25, 2015

(87) PCT Pub. No.: WO2014/156015
PCT Pub. Date: Oct. 2, 2014

(65) Prior Publication Data
US 2016/0052826 A1    Feb. 25, 2016

(30) Foreign Application Priority Data
Mar. 29, 2013  (JP) ................... 2013-071778

(51) Int. Cl.
*H01L 41/187*    (2006.01)
*C04B 35/00*    (2006.01)
(Continued)

(52) U.S. Cl.
CPC .......... *C04B 35/495* (2013.01); *G01L 23/222* (2013.01); *H01L 41/047* (2013.01);
(Continued)

(58) Field of Classification Search
CPC ... C04B 35/495; G01L 23/222; H01L 41/047; H01L 41/08; H01L 41/1132; H01L 41/187; H01L 41/1873; H01L 41/43; H01L 41/09
(Continued)

(56) References Cited

U.S. PATENT DOCUMENTS

| 5,833,875 A | 11/1998 | Hayashi et al. |
| 6,387,295 B1 | 5/2002 | Saito |

(Continued)

FOREIGN PATENT DOCUMENTS

| JP | 8-293635 A | 11/1996 |
| JP | 2000-313664 A | 11/2000 |

(Continued)

OTHER PUBLICATIONS

Search Report dated Jun. 24, 2014 by the International Searching Authority in related Application No. PCT/JP2014/001358.
(Continued)

*Primary Examiner* — Thomas Dougherty
(74) *Attorney, Agent, or Firm* — Sughrue Mion, PLLC

(57) ABSTRACT

A lead-free piezoelectric ceramic composition includes a first crystal phase made of an alkali niobate/tantalate type perovskite oxide having piezoelectric properties, and a second crystal phase made of an M-Ti—O spinel compound
(Continued)

(A) REFLECTED ELECTRON IMAGE OF SAMPLE S01

FIRST CRYSTAL PHASE  HOLES
(PEROVSKITE PHASE)

(B) REFLECTED ELECTRON IMAGE OF SAMPLE S06

HOLES    SECOND CRYSTAL PHASE
        (SPINEL PHASE)
FIRST CRYSTAL PHASE
(PEROVSKITE PHASE)

(where the element M is a monovalent to quadrivalent element).

17 Claims, 20 Drawing Sheets

(51) Int. Cl.

| | | |
|---|---|---|
| *C04B 35/495* | (2006.01) | |
| *G01L 23/22* | (2006.01) | |
| *H01L 41/43* | (2013.01) | |
| *H01L 41/113* | (2006.01) | |
| *H01L 41/047* | (2006.01) | |
| *H01L 41/08* | (2006.01) | |
| *H01L 41/09* | (2006.01) | |
| *H03H 9/02* | (2006.01) | |

(52) U.S. Cl.
CPC .............. *H01L 41/08* (2013.01); *H01L 41/09* (2013.01); *H01L 41/1132* (2013.01); *H01L 41/187* (2013.01); *H01L 41/1873* (2013.01); *H01L 41/43* (2013.01); *C04B 2235/3201* (2013.01); *C04B 2235/3203* (2013.01); *C04B 2235/3206* (2013.01); *C04B 2235/3208* (2013.01); *C04B 2235/3215* (2013.01); *C04B 2235/3232* (2013.01); *C04B 2235/3234* (2013.01); *C04B 2235/3236* (2013.01); *C04B 2235/3244* (2013.01); *C04B 2235/3251* (2013.01); *C04B 2235/3262* (2013.01); *C04B 2235/3272* (2013.01); *C04B 2235/3279* (2013.01); *C04B 2235/3281* (2013.01); *C04B 2235/3284* (2013.01); *C04B 2235/3293* (2013.01); *C04B 2235/3294* (2013.01); *C04B 2235/3418* (2013.01); *C04B 2235/602* (2013.01); *C04B 2235/768* (2013.01); *C04B 2235/80* (2013.01); *H03H 9/02031* (2013.01)

(58) Field of Classification Search
USPC ....... 310/358; 252/62.9 PZ, 62.9 R; 501/501
See application file for complete search history.

(56) References Cited

U.S. PATENT DOCUMENTS

| | | |
|---|---|---|
| 2003/0178605 A1 | 9/2003 | Nonoyama et al. |
| 2012/0146462 A1 | 6/2012 | Yamazaki et al. |
| 2014/0139070 A1 | 5/2014 | Yamazaki et al. |
| 2017/0141292 A1* | 5/2017 | Kozuka ............... H01L 41/1873 |
| 2017/0151293 A1* | 6/2017 | Kovarik ............... A61K 35/747 |

FOREIGN PATENT DOCUMENTS

| | | |
|---|---|---|
| JP | 2003-342069 A | 12/2003 |
| JP | 2008-174424 A | 7/2008 |
| WO | 2011/093021 A1 | 8/2011 |
| WO | 2013/008418 A1 | 1/2013 |
| WO | WO-2014/156015 A1 * | 10/2014 ............. C04B 35/00 |

OTHER PUBLICATIONS

Written Opinion dated Jun. 24, 2014 by the International Searching Authority in related Application No. PCT/JP2014/001358.

* cited by examiner

FIG. 8A

Influence of subphase rate on piezoelectric properties

| Sample | First crystal phase (Main phase) | | | | | | | | | | | | | | | | Second crystal phase (Subphase) | |
|---|---|---|---|---|---|---|---|---|---|---|---|---|---|---|---|---|---|---|
| | Element C | Element D | Element E | a | b | c | Coefficient d of element C | | e | Coefficient f of element D | | | Coefficient g of element E | | | Subphase rate (Vol%) | Element M |
| | | | | | | | d1 | d2 | | f1 | f2 | f3 | g1 | g2 | g3 | | |
| S01(*) | - | Nb | - | 0.500 | 0.500 | 0 | 0 | 0 | 1.00 | 1.000 | 0 | 0 | 0 | 0 | 0 | 0 | - |
| S02(*) | - | Nb | - | 0.490 | 0.490 | 0.020 | 0 | 0 | 1.00 | 1.000 | 0 | 0 | 0 | 0 | 0 | 0 | - |
| S03 | Ca, Ba | Nb, Ti, Zr | Co, Zn | 0.435 | 0.487 | 0.022 | 0.021 | 0.035 | 1.01 | 0.945 | 0.021 | 0.025 | 0.005 | 0.005 | 0 | 0.44 | Co, Zn |
| S04 | Ca, Ba | Nb, Ti, Zr | Co, Zn | 0.435 | 0.487 | 0.022 | 0.021 | 0.035 | 1.01 | 0.945 | 0.021 | 0.025 | 0.005 | 0.005 | 0 | 0.80 | Co, Zn |
| S05 | Ca, Ba | Nb, Ti, Zr | Co, Zn | 0.435 | 0.487 | 0.022 | 0.021 | 0.035 | 1.01 | 0.945 | 0.021 | 0.025 | 0.005 | 0.005 | 0 | 1.24 | Co, Zn |
| S06 | Ca, Ba | Nb, Ti, Zr | Co, Zn | 0.435 | 0.487 | 0.022 | 0.021 | 0.035 | 1.01 | 0.945 | 0.021 | 0.025 | 0.005 | 0.005 | 0 | 1.33 | Co, Zn |
| S07 | Ca, Ba | Nb, Ti, Zr | Co, Zn | 0.435 | 0.487 | 0.022 | 0.021 | 0.035 | 1.01 | 0.945 | 0.021 | 0.025 | 0.005 | 0.005 | 0 | 1.42 | Co, Zn |
| S08 | Ca, Ba | Nb, Ti, Zr | Co, Zn | 0.435 | 0.487 | 0.022 | 0.021 | 0.035 | 1.01 | 0.945 | 0.021 | 0.025 | 0.005 | 0.005 | 0 | 1.90 | Co, Zn |
| S09 | Ca, Ba | Nb, Ti, Zr | Co, Zn | 0.435 | 0.487 | 0.022 | 0.021 | 0.035 | 1.01 | 0.945 | 0.021 | 0.025 | 0.005 | 0.005 | 0 | 2.43 | Co, Zn |
| S10 | Ca, Ba | Nb, Ti, Zr | Co, Zn | 0.435 | 0.487 | 0.022 | 0.021 | 0.035 | 1.01 | 0.945 | 0.021 | 0.025 | 0.005 | 0.005 | 0 | 3.54 | Co, Zn |
| S11 | Ca, Ba | Nb, Ti, Zr | Co, Zn | 0.435 | 0.487 | 0.022 | 0.021 | 0.035 | 1.01 | 0.945 | 0.021 | 0.025 | 0.005 | 0.005 | 0 | 4.42 | Co, Zn |
| S12 | Ca, Ba | Nb, Ti, Zr | Co, Zn | 0.435 | 0.487 | 0.022 | 0.021 | 0.035 | 1.01 | 0.945 | 0.021 | 0.025 | 0.005 | 0.005 | 0 | 5.30 | Co, Zn |

First crystal phase (Main phase): $(K_a Na_b Li_c Cd)_e (D_f E_g) O_h$
(where the element C includes one or more elements selected from the group consisting of Ca, Sr, and Ba, the element D includes one or more elements selected from the group consisting of Nb, Ta, Ti, and Zr while including at least Nb or Ta, and the element E includes one or more elements selected from the group consisting of Mg, Al, Sc, Mn, Fe, Co, Ni, Zn, Ga, and Y, and where $a + b + c + d = 1$, $e$ is arbitrary, $f + g = 1$, and h is an arbitrary value that forms perovskite.)

Second crystal phase (Subphase): $M_x Ti O_y$
(where the element M includes one or more elements selected from the group consisting of Li, Mg, Al, Sc, Cr, Mn, Fe, Co, Ni, Zn, Ga, Y, and Zr, and where the coefficients x and y are relative values with respect to the Ti content, $0.5 \leq x \leq 5.0$, and the coefficient y is an arbitrary value that forms spinel.)

(*) indicates a comparative example.

FIG. 8B

Influence of subphase rate on piezoelectric properties

| Sample | First crystal phase (Main phase) Composition | Second crystal phase (Subphase) Subphase rate (Vol%) | Second crystal phase (Subphase) Element M | Second crystal phase (Subphase) Composition | Relative permittivity $\varepsilon_{33}{}^T/\varepsilon_0$ | Piezoelectric constant $d_{33}$(pC/N) | Electromechanical coupling coefficient kr | Room-temperature phase transition point |
|---|---|---|---|---|---|---|---|---|
| S01(*) | FIG. 8A | 0 | - | - | 430 | 90 | 0.30 | Present |
| S02(*) | do. | 0 | - | - | 430 | 95 | 0.31 | Present |
| S03 | do. | 0.44 | Co, Zn | CoZnTiO$_4$ | 1470 | 91 | 0.21 | Absent |
| S04 | do. | 0.80 | Co, Zn | CoZnTiO$_4$ | 1520 | 208 | 0.42 | Absent |
| S05 | do. | 1.24 | Co, Zn | CoZnTiO$_4$ | 1554 | 255 | 0.46 | Absent |
| S06 | do. | 1.33 | Co, Zn | CoZnTiO$_4$ | 1700 | 298 | 0.53 | Absent |
| S07 | do. | 1.42 | Co, Zn | CoZnTiO$_4$ | 1761 | 288 | 0.52 | Absent |
| S08 | do. | 1.90 | Co, Zn | CoZnTiO$_4$ | 1650 | 245 | 0.49 | Absent |
| S09 | do. | 2.43 | Co, Zn | CoZnTiO$_4$ | 1600 | 211 | 0.41 | Absent |
| S10 | do. | 3.54 | Co, Zn | CoZnTiO$_4$ | 1560 | 194 | 0.40 | Absent |
| S11 | do. | 4.42 | Co, Zn | CoZnTiO$_4$ | 1530 | 190 | 0.37 | Absent |
| S12 | do. | 5.30 | Co, Zn | CoZnTiO$_4$ | 1500 | 122 | 0.24 | Absent |

First crystal phase (Main phase): $(K_aNa_bLi_cC_d)_e(D_fE_g)O_h$
(where the element C includes one or more elements selected from the group consisting of Ca, Sr, and Ba, the element D includes one or more elements selected from the group consisting of Nb, Ta, Ti, and Zr while including at least Nb or Ta, and the element E includes one or more elements selected from the group consisting of Mg, Al, Sc, Mn, Fe, Co, Ni, Zn, Ga, and Y, and where $a + b + c + d = 1$, e is arbitrary, $f + g = 1$, and h is an arbitrary value that forms perovskite.)

Second crystal phase (Subphase): $M_xTiO_y$
(where the element M includes one or more elements selected from the group consisting of Li, Mg, Al, Sc, Cr, Mn, Fe, Co, Ni, Zn, Ga, Y, and Zr, and where the coefficients x and y are relative values with respect to the Ti content, $0.5 \leq x \leq 5.0$, and the coefficient y is an arbitrary value that forms spinel.)

(*) indicates a comparative example.

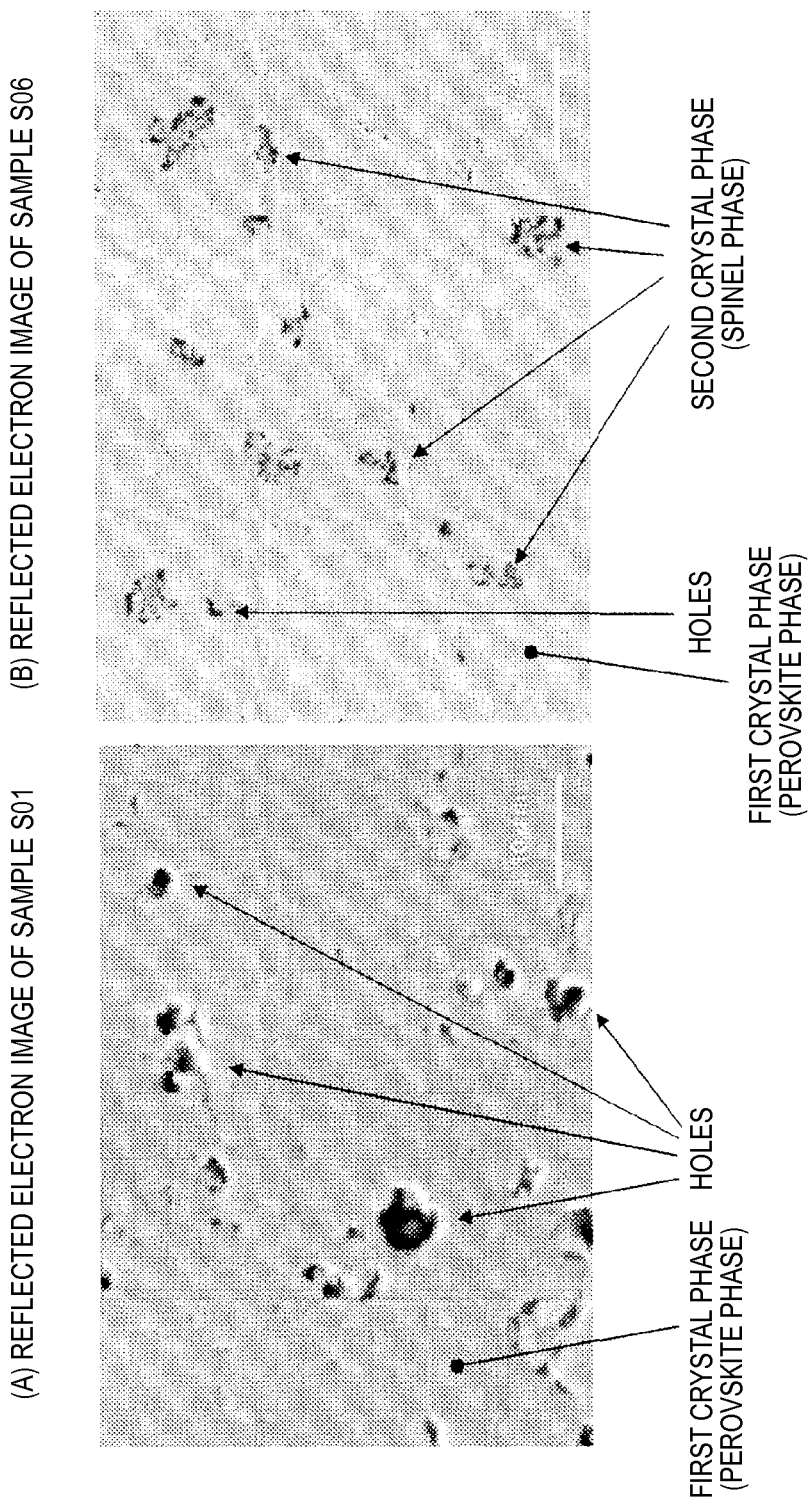

FIG. 11A

Influence of type of metallic element M of subphase (No. 1)

| Sample | First crystal phase (Main phase) | | | | | | | | | | | | | | Second crystal phase (Subphase) | |
|---|---|---|---|---|---|---|---|---|---|---|---|---|---|---|---|---|
| | Element C | Element D | Element E | a | b | c | Coefficient d of element C | | e | Coefficient f of element E | | | Coefficient g of element E | | | Element M |
| | | | | | | | d1 | d2 | | f1 | f2 | f3 | g1 | g2 | g3 | Subphase rate (Vol%) | |
| S06 | Ca, Ba | Nb, Ti, Zr | Co, Zn | 0.435 | 0.487 | 0.022 | 0.021 | 0.035 | 1.01 | 0.945 | 0.021 | 0.025 | 0.005 | 0.005 | 0 | 1.33 | Co, Zn |
| S13 | Ca, Ba | Nb, Ti, Zr | Co | 0.488 | 0.409 | 0.027 | 0.026 | 0.050 | 1.00 | 0.953 | 0.022 | 0.025 | 0.008 | 0 | 0 | 1.40 | Co |
| S14 | Ca, Ba | Nb, Ti, Zr | Zn | 0.488 | 0.409 | 0.027 | 0.026 | 0.050 | 1.00 | 0.953 | 0.022 | 0.025 | 0.008 | 0 | 0 | 1.40 | Zn |
| S15 | Ca, Ba | Nb, Ti, Zr | Fe | 0.488 | 0.409 | 0.027 | 0.026 | 0.050 | 1.00 | 0.953 | 0.022 | 0.025 | 0.008 | 0 | 0 | 1.40 | Fe |
| S16 | Ca, Ba | Nb, Ti, Zr | Al | 0.488 | 0.409 | 0.027 | 0.026 | 0.050 | 1.00 | 0.953 | 0.022 | 0.025 | 0.008 | 0 | 0 | 1.40 | Li, Al |
| S17 | Ca, Ba | Nb, Ti, Zr | Mn | 0.488 | 0.409 | 0.027 | 0.026 | 0.050 | 1.00 | 0.953 | 0.022 | 0.025 | 0.008 | 0 | 0 | 1.40 | Mn |
| S18 | Ca, Ba | Nb, Ti, Zr | Mg | 0.488 | 0.409 | 0.027 | 0.026 | 0.050 | 1.00 | 0.953 | 0.025 | 0.025 | 0.008 | 0 | 0 | 1.40 | Mg |
| S19 | Ca, Ba | Nb, Ti, Zr | Ni | 0.488 | 0.409 | 0.027 | 0.026 | 0.050 | 1.00 | 0.953 | 0.025 | 0.025 | 0.008 | 0 | 0 | 1.40 | Ni |
| S20 | Ca, Ba | Nb, Ti, Zr | - | 0.488 | 0.409 | 0.027 | 0.026 | 0.050 | 1.00 | 0.953 | 0.022 | 0.033 | 0 | 0 | 0 | 1.40 | Li, Zr |
| S21 | Ca, Ba | Nb, Ti, Zr | Fe, Zn | 0.488 | 0.409 | 0.027 | 0.026 | 0.050 | 1.00 | 0.953 | 0.025 | 0.025 | 0.007 | 0 | 0 | 1.40 | Fe, Zn |
| S22 | Ca, Ba | Nb, Ti, Zr | Fe, Zn, Co | 0.488 | 0.409 | 0.027 | 0.026 | 0.050 | 1.00 | 0.953 | 0.025 | 0.025 | 0.007 | 0.002 | 0.008 | 1.40 | Fe, Zn, Co |
| S23(*) | Ca, Ba | Nb, Ti, Zr | Sr | 0.488 | 0.409 | 0.027 | 0.026 | 0.050 | 1.00 | 0.953 | 0.022 | 0.025 | 0.008 | 0 | 0 | 1.40 | Sr |

First crystal phase (Main phase): $(K_a Na_b Li_c C_d)_e (D_f E_g) O_h$
(where the element C includes one or more elements selected from the group consisting of Ca, Sr, and Ba, the element D includes one or more elements selected from the group consisting of Nb, Ta, Ti, and Zr while including at least Nb or Ta, and the element E includes one or more elements selected from the group consisting of Mg, Al, Sc, Mn, Fe, Co, Ni, Zn, Ga, and Y, and where $a + b + c + d = 1$, e is arbitrary, $f + g = 1$, and h is an arbitrary value that forms perovskite.)

Second crystal phase (Subphase): $M_x TiO_y$
(where the element M includes one or more elements selected from the group consisting of Li, Mg, Al, Sc, Cr, Mn, Fe, Co, Ni, Zn, Ga, Y, and Zr, and where the coefficients x and y are relative values with respect to the Ti content, $0.5 \leq x \leq 5.0$, and the coefficient y is an arbitrary value that forms spinel.)

(*) indicates a comparative example.
(In sample S23, the second crystal phase did not form a spinel compound but formed a perovskite phase.)

FIG. 11B

Influence of type of metallic element M of subphase (No. 1)

| Sample | First crystal phase (Main phase) Composition | Second crystal phase (Subphase) Subphase rate (Vol%) | Second crystal phase (Subphase) Element M | Second crystal phase (Subphase) Composition | Relative permittivity $\varepsilon_{33}^T/\varepsilon_0$ | Dielectric loss $\tan\delta$ | Piezoelectric constant $d_{33}$(pC/N) | Electro-mechanical coupling coefficient kr | Electro-mechanical coupling coefficient kt | Mechanical quality factor Qm | Curie point Tc(°C) |
|---|---|---|---|---|---|---|---|---|---|---|---|
| S06 | FIG. 11A | 1.33 | Co, Zn | CoZnTiO$_4$ | 1700 | 0.018 | 298 | 0.53 | 0.49 | 67 | 315 |
| S13 | do. | 1.40 | Co | Co$_2$TiO$_4$ | 1772 | 0.022 | 283 | 0.51 | 0.47 | 50 | 323 |
| S14 | do. | 1.40 | Zn | Zn$_2$TiO$_4$ | 1652 | 0.025 | 257 | 0.51 | 0.40 | 61 | 322 |
| S15 | do. | 1.40 | Fe | Fe$_2$TiO$_4$ | 1667 | 0.024 | 301 | 0.54 | 0.49 | 61 | 310 |
| S16 | do. | 1.40 | Li, Al | LiAlTiO$_4$ | 1799 | 0.023 | 270 | 0.51 | 0.45 | 56 | 320 |
| S17 | do. | 1.40 | Mn | Mn$_2$TiO$_4$ | 1620 | 0.016 | 233 | 0.46 | 0.37 | 91 | 322 |
| S18 | do. | 1.40 | Mg | Mg$_2$TiO$_4$ | 1810 | 0.027 | 270 | 0.52 | 0.55 | 62 | 321 |
| S19 | do. | 1.40 | Ni | Ni$_2$TiO$_4$ | 1757 | 0.034 | 295 | 0.54 | 0.46 | 59 | 330 |
| S20 | do. | 1.40 | Li, Zr | Li$_{1.33}$(Zr, Ti)$_{1.67}$O$_4$ | 1330 | 0.026 | 256 | 0.49 | 0.40 | 71 | 320 |
| S21 | do. | 1.40 | Fe, Zn | FeZnTiO$_4$ | 1847 | 0.022 | 299 | 0.56 | 0.47 | 57 | 315 |
| S22 | do. | 1.40 | Fe, Zn, Co | (Fe,Zn,Co)$_2$TiO$_4$ | 1780 | 0.021 | 274 | 0.52 | 0.47 | 60 | 340 |
| S23(*) | do. | 1.40 | Sr | SrTiO$_3$ | 1320 | 0.037 | 116 | 0.28 | 0.28 | 97 | 300 |

First crystal phase (Main phase): $(K_aNa_bLi_cC_d)_e(D_fE_g)O_h$
(where the element C includes one or more elements selected from the group consisting of Ca, Sr, and Ba, the element D includes one or more element selected from the group consisting of Nb, Ta, Ti, and Zr while including at least Nb or Ta, and the element E includes one or more elements selected from the group consisting of Mg, Al, Sc, Mn, Fe, Co, Ni, Zn, Ga, and Y, and where $a + b + c + d = 1$, $e$ is arbitrary, $f + g = 1$, and $h$ is an arbitrary value that forms perovskite.)

Second crystal phase (Subphase): $M_xTiO_y$
(where the element M includes one or more elements selected from the group consisting of Li, Mg, Al, Sc, Cr, Mn, Fe, Co, Ni, Zn, Ga, Y, and Zr, and where the coefficients x and y are relative values with respect to the Ti content, $0.5 \leq x \leq 5.0$, and the coefficient y is an arbitrary value that forms spinel.)

(*) indicates a comparative example.
(In sample S23, the second crystal phase did not form a spinel compound but formed a perovskite phase.)

FIG. 12A

Influence of type of metallic element M of subphase (No. 2)

| Sample | First crystal phase (Main phase): $(K_aNa_bLi_cC_d)e(D_fE_g)O_n$ ||||||||||||||| Second crystal phase (Subphase) ||
| --- | --- | --- | --- | --- | --- | --- | --- | --- | --- | --- | --- | --- | --- | --- | --- | --- |
| | Element C | Element D | Element E | a | b | c | Coefficient d of element C || e | Coefficient f of element D |||| Coefficient g of element E ||| Rate (Vol%) | Element M |
| | | | | | | | d1 | d2 | | f1 | f2 | f3 | f4 | g1 | g2 | g3 | | |
| S100 | Ca, Ba | Nb, Ti, Zr | Ni, Fe | 0.491 | 0.422 | 0.021 | 0.044 | 0.023 | 1.00 | 0.944 | 0.021 | 0.025 | 0 | 0.005 | 0.005 | 0 | 1.80 | Ni, Fe |
| S101 | Ca, Ba | Nb, Ti, Zr | Mg, Fe | 0.490 | 0.422 | 0.021 | 0.042 | 0.024 | 0.99 | 0.942 | 0.022 | 0.025 | 0 | 0.008 | 0.004 | 0 | 1.80 | Mg, Fe |
| S102 | Ca, Ba | Nb, Ti, Zr | Fe, Al | 0.487 | 0.422 | 0.021 | 0.045 | 0.025 | 1.06 | 0.954 | 0.019 | 0.016 | 0 | 0.005 | 0.005 | 0 | 1.80 | Fe, Al, Li |
| S103 | Ca, Ba | Nb, Ti, Zr | Mn, Al | 0.490 | 0.423 | 0.021 | 0.044 | 0.022 | 1.06 | 0.954 | 0.019 | 0.016 | 0 | 0.005 | 0.005 | 0 | 1.80i | Mn, Al, Li |
| S104 | Ca, Ba | Nb, Ti, Zr | Mg, Mg | 0.486 | 0.427 | 0.021 | 0.042 | 0.024 | 1.05 | 0.949 | 0.019 | 0.021 | 0 | 0.005 | 0.005 | 0 | 1.80 | Mg, Mn |
| S105 | Ca, Ba | Nb, Ti, Zr | Ni, Mg | 0.532 | 0.383 | 0.021 | 0.041 | 0.022 | 1.05 | 0.949 | 0.019 | 0.021 | 0 | 0.005 | 0.005 | 0 | 1.80 | Ni, Mg |
| S106 | Ca, Ba | Nb, Ti, Zr | Ni | 0.481 | 0.430 | 0.021 | 0.043 | 0.025 | 1.05 | 0.949 | 0.019 | 0.026 | 0 | 0.005 | 0 | 0 | 1.80 | Ni, Zr |
| S107 | Ca, Ba | Nb, Ti, Hf | Ni | 0.481 | 0.430 | 0.021 | 0.043 | 0.025 | 1.05 | 0.949 | 0.019 | 0.026 | 0 | 0.005 | 0 | 0 | 1.80 | Ni, Hf |
| S108 | Ca, Ba | Nb, Ti, Zr | Ni, Zn | 0.486 | 0.427 | 0.021 | 0.042 | 0.024 | 1.05 | 0.949 | 0.019 | 0.021 | 0 | 0.005 | 0.005 | 0 | 1.80 | Ni, Zn |
| S109 | Ca, Ba | Nb, Ti, Zr | Fe, Ni | 0.486 | 0.427 | 0.021 | 0.042 | 0.024 | 1.04 | 0.939 | 0.019 | 0.021 | 0 | 0.016 | 0.005 | 0 | 1.80 | Fe, Ni |
| S110 | Ca, Ba | Nb, Ti, Zr | Sc | 0.486 | 0.427 | 0.021 | 0.042 | 0.024 | 1.06 | 0.954 | 0.019 | 0.021 | 0 | 0.005 | 0.000 | 0 | 1.80 | Sc, Li |
| S111 | Ca, Ba | Nb, Ti, Zr | Co, Mg | 0.488 | 0.409 | 0.027 | 0.026 | 0.050 | 1.05 | 0.949 | 0.019 | 0.021 | 0 | 0.005 | 0.005 | 0 | 1.80 | Co, Mg |
| S112 | Ca, Ba | Nb, Ti, Zr | Co, Ni | 0.488 | 0.409 | 0.027 | 0.026 | 0.050 | 1.05 | 0.949 | 0.019 | 0.021 | 0 | 0.005 | 0.005 | 0 | 1.80 | Co, Ni |
| S113 | Ca, Ba | Nb, Ti, Zr | Mg, Zn | 0.488 | 0.409 | 0.027 | 0.026 | 0.050 | 1.05 | 0.949 | 0.019 | 0.021 | 0 | 0.005 | 0.005 | 0 | 1.80 | Mg, Zn |
| S114 | Ca, Ba | Nb, Ti, Zr | Co, Fe | 0.488 | 0.409 | 0.027 | 0.026 | 0.035 | 1.05 | 0.949 | 0.019 | 0.021 | 0 | 0.005 | 0.005 | 0 | 1.80 | Co, Fe |
| S115 | Ca, Ba | Nb, Ti, Zr | Co, Fe | 0.435 | 0.487 | 0.022 | 0.021 | 0.035 | 1.05 | 0.949 | 0.019 | 0.021 | 0 | 0.005 | 0.005 | 0 | 1.80 | Co, Fe |
| S116 | Ca, Ba | Nb, Ti, Ta | Co, Fe | 0.435 | 0.487 | 0.022 | 0.021 | 0.035 | 1.05 | 0.949 | 0.019 | 0.021 | 0 | 0.005 | 0.005 | 0 | 1.80 | Co, Fe |
| S117 | Ca, Sr | Nb, Ti, Zr | Co, Fe | 0.435 | 0.487 | 0.022 | 0.021 | 0.035 | 1.05 | 0.949 | 0.019 | 0.021 | 0 | 0.005 | 0.005 | 0 | 1.80 | Co, Fe |
| S118 | Ca, Ba | Nb, Ti, Zn, Sn | Zn | 0.435 | 0.487 | 0.022 | 0.021 | 0.035 | 1.04 | 0.935 | 0.019 | 0.021 | 0.021 | 0.005 | 0.000 | 0 | 1.80 | Zn, Sn |
| S119 | Ca, Ba | Nb, Ti, Zn, Sb | Zn | 0.435 | 0.487 | 0.022 | 0.021 | 0.035 | 1.04 | 0.935 | 0.019 | 0.021 | 0.021 | 0.005 | 0000 | 0 | 1.80 | Zn, Sb |
| S120 | Ca, Ba | Nb, Ti, Zn, Si | Zn | 0.435 | 0.487 | 0.022 | 0.021 | 0.035 | 1.05 | 0.944 | 0.019 | 0.021 | 0.010 | 0.005 | 0.000 | 0 | 1.80 | Zn, Si |

FIG. 12B

Influence of type of metallic element M of subphase (No. 2)

| Sample | First crystal phase (Main phase): $(K_aNa_bLi_cC_d)e(D_fE_g)O_h$ |||||||||||||||| Second crystal phase (Subphase) ||
|---|---|---|---|---|---|---|---|---|---|---|---|---|---|---|---|---|---|
| | Element C | Element D | Element E | a | b | c | Coefficient d of element C || e | Coefficient f of element D |||| Coefficient g of element E ||| Rate (Vol%) | Element M |
| | | | | | | | d1 | d2 | | f1 | f2 | f3 | f4 | g1 | g2 | g3 | | |
| S121 | Ca, Ba | Nb, Ti, Zr | Fe | 0.435 | 0.487 | 0.022 | 0.021 | 0.035 | 1.06 | 0.954 | 0.019 | 0.021 | 0 | 0.005 | 0.000 | 0 | 1.80 | Fe |
| S122 | Ca, Ba | Nb, Ti, Zr | Ni | 0.435 | 0.487 | 0.022 | 0.021 | 0.035 | 1.06 | 0.954 | 0.019 | 0.021 | 0 | 0.005 | 0.000 | 0 | 1.80 | Ni |
| S123 | Ca, Ba | Nb, Ti, Zr | Mg | 0.435 | 0.487 | 0.022 | 0.021 | 0.035 | 1.06 | 0.954 | 0.019 | 0.021 | 0 | 0.005 | 0.000 | 0 | 1.80 | Mg |
| S124 | Ca, Ba | Nb, Ti, Zr | Zn | 0.435 | 0.487 | 0.022 | 0.021 | 0.035 | 1.06 | 0.954 | 0.019 | 0.021 | 0 | 0.005 | 0.000 | 0 | 1.80 | Zn |
| S125 | Ca, Ba | Nb, Ti, Zr | Mn | 0.435 | 0.487 | 0.022 | 0.021 | 0.035 | 1.06 | 0.954 | 0.019 | 0.021 | 0 | 0.005 | 0.000 | 0 | 1.80 | Mn |
| S126 | Ca, Ba | Nb, Ti, Zr | Co | 0.435 | 0.487 | 0.022 | 0.021 | 0.035 | 1.06 | 0.954 | 0.019 | 0.021 | 0 | 0.005 | 0.000 | 0 | 1.80 | Co |
| S127 | Ca, Ba | Nb, Ti, Zr | Fe, Zn Co | 0.507 | 0.403 | 0.023 | 0.043 | 0.024 | 1.04 | 0.947 | 0.028 | 0.021 | 0 | 0.002 | 0.002 | 0.003 | 1.50 | Fe, Zn, Co |
| S128 | Ca, Ba | Nb, Ti, Hf | Fe, Zn Co | 0.500 | 0.405 | 0.023 | 0.045 | 0.026 | 1.03 | 0.947 | 0.028 | 0.021 | 0 | 0.002 | 0.002 | 0.002 | 1.60 | Fe, Zn, Co |
| S129 | Ca, Ba | Nb, Ti, Zr | Fe, Zn Co | 0.498 | 0.407 | 0.023 | 0.047 | 0.026 | 1.02 | 0.947 | 0.027 | 0.022 | 0 | 0.002 | 0.002 | 0.002 | 1.70 | Fe, Zn, Co |
| S130 | Ca, Ba | Nb, Ti, Zr | Fe, Zn Co | 0.426 | 0.507 | 0.019 | 0.029 | 0.018 | 1.00 | 0.956 | 0.022 | 0.020 | 0 | 0.001 | 0.001 | 0.001 | 1.60 | Fe, Zn, Co |
| S131 | Ca, Ba | Nb, Ti, Si | Fe, Zn Co | 0.429 | 0.509 | 0.019 | 0.031 | 0.012 | 1.00 | 0.961 | 0.024 | 0.013 | 0 | 0.001 | 0.002 | 0.001 | 1.50 | Fe, Zn, Co |

FIG. 12C

Influence of type of metallic element M of subphase (No. 2)

| Sample | First crystal phase (Main phase) Composition | Second crystal phase (Subphase) Rate (Vol%) | Second crystal phase (Subphase) Element M | Second crystal phase (Subphase) Composition | Third crystal phase (Subphase) Rate (Vol%) | Third crystal phase (Subphase) Composition | Relative permittivity $\varepsilon_{33}^T/\varepsilon_0$ | Dielectric loss tan$\delta$ | Piezoelectric constant $d_{33}$(pC/N) | Electromechanical coupling co-efficient kr | Electromechanical coupling co-efficient kt | Mechanical quality factor Qm | Curie point Tc(°C) |
|---|---|---|---|---|---|---|---|---|---|---|---|---|---|
| S100 | FIG. 12A | 1.80 | Ni, Fe | NiFeTiO$_4$ | 0.1 or less | (Ba, Na, K)$_3$(Nb, Ni, Fe)$_5$O$_{15}$ | 1720 | 0.021 | 317 | 0.55 | 0.48 | 62 | 317 |
| S101 | do. | 1.80 | Mg, Fe | MgFeTiO$_4$ | Absent | - | 1650 | 0.022 | 319 | 0.55 | 0.47 | 60 | 318 |
| S102 | do. | 1.80 | Li, Fe, Al | LiFe$_{0.5}$Ti$_{1.5}$O$_4$ | Absent | - | 1800 | 0.024 | 285 | 0.52 | 0.45 | 74 | 319 |
| S103 | do. | 1.80 | Li, Mn, Al | LiMn$_{0.5}$Ti$_{1.5}$O$_4$ | Absent | - | 1700 | 0.014 | 245 | 0.50 | 0.44 | 146 | 327 |
| S104 | do. | 1.80 | Mg, Mn | MgMnTiO$_4$ | Absent | - | 1620 | 0.013 | 257 | 0.51 | 0.45 | 143 | 325 |
| S105 | do. | 1.80 | Ni, Mg | MgNiTiO$_4$ | Absent | - | 1680 | 0.023 | 299 | 0.53 | 0.47 | 65 | 323 |
| S106 | do. | 1.80 | Ni, Zr | Ni$_2$(Ti, Zr)O$_4$ | 0.3 | (Ba, Na, K)$_3$(Nb, Ni, Zr)$_5$O$_{15}$ | 1720 | 0.020 | 316 | 0.56 | 0.49 | 53 | 328 |
| S107 | do. | 1.80 | Ni, Hf | Ni$_2$(Ti, Hf)O$_4$ | 0.3 | (Ba, Na, K)$_3$(Nb, Ni, Hf)$_5$O$_{15}$ | 1800 | 0.022 | 300 | 0.54 | 0.46 | 60 | 320 |
| S108 | do. | 1.80 | Ni, Zn | ZnNiTiO$_4$ | Absent | - | 1560 | 0.027 | 277 | 0.52 | 0.45 | 67 | 324 |
| S109 | do. | 1.80 | Fe, Ni | Ni$_{1.5}$Fe$_{0.5}$O$_4$ | 0.1 or less | (Ba, Na, K)$_3$(Nb, Ni, Fe)$_5$O$_{15}$ | 1540 | 0.020 | 314 | 0.54 | 0.46 | 60 | 319 |
| S110 | do. | 1.80 | Sc, Li | LiScTiO$_4$ | Absent | - | 1750 | 0.020 | 292 | 0.54 | 0.45 | 55 | 316 |
| S111 | do. | 1.80 | Co, Mg | CoMgTiO$_4$ | Absent | - | 1680 | 0.021 | 318 | 0.54 | 0.47 | 66 | 324 |
| S112 | do. | 1.80 | Co, Ni | CoNiTiO$_4$ | 0.1 or less | (Ba, Na, K)$_3$(Nb, Co, Ni)$_5$O$_{15}$ | 1710 | 0.022 | 288 | 0.54 | 0.47 | 59 | 321 |
| S113 | do. | 1.80 | Mg, Zn | ZnMgTiO$_4$ | Absent | - | 1690 | 0.021 | 293 | 0.53 | 0.46 | 62 | 326 |
| S114 | do. | 1.80 | Co, Fe | CoFeTiO$_4$ | Absent | - | 1715 | 0.021 | 295 | 0.55 | 0.48 | 60 | 316 |
| S115 | do. | 1.80 | Co, Fe | CoFeTiO$_4$ | Absent | - | 1650 | 0.020 | 320 | 0.55 | 0.48 | 54 | 315 |
| S116 | do. | 1.80 | Co, Fe | CoFeTiO$_4$ | Absent | - | 1830 | 0.024 | 282 | 0.53 | 0.46 | 52 | 307 |
| S117 | do. | 1.80 | Co, Fe | CoFeTiO$_4$ | Absent | - | 1880 | 0.025 | 300 | 0.54 | 0.46 | 55 | 318 |
| S118 | do. | 1.80 | Zn, Sn | Zn$_2$(Ti, Sn)$_4$ | Absent | - | 1820 | 0.018 | 301 | 0.52 | 0.45 | 49 | 323 |
| S119 | do. | 1.80 | Zn, Sb | Zn$_2$(Ti, Sb)$_4$ | Absent | - | 1720 | 0.024 | 278 | 0.52 | 0.46 | 58 | 309 |
| S120 | do. | 2.00 | Zn, Si | Zn$_2$(Ti, Si)$_4$ | Absent | - | 1710 | 0.022 | 290 | 0.52 | 0.45 | 51 | 300 |

FIG. 12D

Influence of type of metallic element M of subphase (No. 2)

| Sample | First crystal phase (Main phase) Composition | Second crystal phase (Subphase) Rate (Vol%) | Second crystal phase (Subphase) Element M | Second crystal phase (Subphase) Composition | Third crystal phase (Subphase) Rate (Vol%) | Third crystal phase (Subphase) Composition | Relative permittivity $\varepsilon_{33}^T/\varepsilon_0$ | Dielectric loss $\tan\delta$ | Piezoelectric constant $d_{33}$(pC/N) | Electromechanical coupling coefficient kr | Electromechanical coupling coefficient kt | Mechanical quality factor Qm | Curie point Tc(°C) |
|---|---|---|---|---|---|---|---|---|---|---|---|---|---|
| S121 | FIG. 12B | 1.80 | Fe | $Fe_2TiO_4$ | 0.2 | $(Ba, Na, K)_3(Nb, Fe)_5O_{15}$ | 1730 | 0.021 | 263 | 0.52 | 0.46 | 65 | 310 |
| S122 | do. | 1.80 | Ni | $Ni_2TiO_4$ | 0.1 or less | $(Ba, Na, K)_3(Nb, Ni)_5O_{15}$ | 1760 | 0.018 | 270 | 0.50 | 0.45 | 62 | 319 |
| S123 | do. | 1.80 | Mg | $Mg_2TiO_4$ | Absent | - | 1745 | 0.018 | 271 | 0.51 | 0.46 | 61 | 321 |
| S124 | do. | 1.80 | Zn | $Zn_2TiO_4$ | 0.2 | $(Ba, Na, K)_3(Nb, Zn)_5O_{15}$ | 1600 | 0.030 | 250 | 0.51 | 0.44 | 62 | 322 |
| S125 | do. | 1.80 | Mn | $Mn_2TiO_4$ | 0.2 | $(Ba, Na, K)_3(Nb, Mn)_5O_{15}$ | 1590 | 0.011 | 222 | 0.45 | 0.41 | 120 | 322 |
| S126 | do. | 1.80 | Co | $Co_2TiO_4$ | Absent | - | 1700 | 0.022 | 262 | 0.49 | 0.41 | 55 | 323 |
| S127 | do. | 1.50 | Fe, Zn, Co | (Fe, Zn, Co)$TiO_4$ | 0.1 or less | $(Ba, Na, K)_3(Nb, Ni, Zr)_5O_{15}$ | 1760 | 0.018 | 295 | 0.52 | 0.47 | 68 | 324 |
| S128 | do. | 1.60 | Fe, Zn, Co | (Fe, Zn, Co)$TiO_4$ | 0.1 or less | $(Ba, Na, K)_3(Nb, Ni, Hf)_5O_{15}$ | 1510 | 0.022 | 290 | 0.51 | 0.46 | 75 | 328 |
| S129 | do. | 1.70 | Fe, Zn, Co | (Fe, Zn, Co)$TiO_4$ | 0.1 or less | $(Ba, Na, K)_3(Nb, Ni, Zr)_5O_{15}$ | 1340 | 0.024 | 280 | 0.51 | 0.44 | 75 | 330 |
| S130 | do. | 1.60 | Fe, Zn, Co | (Fe, Zn, Co)$TiO_4$ | 0.1 or less | $(Ba, Na, K)_3(Nb, Ni, Fe)_5O_{15}$ | 1630 | 0.015 | 285 | 0.50 | 0.46 | 66 | 320 |
| S131 | do. | 1.50 | Fe, Zn, Co | (Fe, Zn, Co)$TiO_4$ | 0.1 or less | $(Ba, Na, K)_3(Nb, Ni, Zr)_5O_{15}$ | 1845 | 0.018 | 310 | 0.56 | 0.49 | 48 | 318 |

FIG. 13

Evaluation result on insulation properties

| Sample | Subphase rate (Vol%) | $d_{33}$ (pC/N) | Polarization condition (polarization time: 30 min.) | | |
|---|---|---|---|---|---|
| | | | 25°C_7kV/mm | 40°C_7kV/mm | 80°C_9kV/mm |
| S01(*) | 0 | 90 | NG | NG | NG |
| S03 | 0.44 | 61 | OK | OK | NG |
| S06 | 1.33 | 298 | OK | OK | OK |
| S08 | 1.90 | 245 | OK | OK | OK |

Direct voltage was placed and a breakage state of element was evaluated.

(*) indicates a comparative example.

FIG. 14

Evaluation on high-temperature endurance

| Sample | $d_{33}$(pC/N) | | Degradation rate (%) |
|---|---|---|---|
| | Initial | After aging | |
| S01(*) | 90 | 60 | -33.3 |
| S22 | 274 | 264 | -3.6 |

Piezoelectric properties after aging at 200%°C for 10 h were compared.

(*) indicates a comparative example.

FIG. 15

Result on thermal cycle test

| Sample | $d_{33}$(pC/N) | | Degradation rate (%) |
|---|---|---|---|
| | Initial | After thermal cycle | |
| S02(*) | 95 | 63 | -66 |
| S129 | 280 | 276 | -1.4 |
| S130 | 285 | 279 | -2.1 |
| S131 | 310 | 299 | -3.5 |

(*) indicates a comparative example.

FIG. 16A

Influence of coefficient e of first crystal phase (main phase) (No.1)

| Sample | First crystal phase (Main phase) | | | | | | | | | | | | Second crystal phase (Subphase) | |
|---|---|---|---|---|---|---|---|---|---|---|---|---|---|---|
| | Element C | Element D | Element E | a | b | c | Coefficient d of element C | | e | Coefficient f of element D | | | g | Subphase rate (Vol%) | Element M |
| | | | | | | | d1 | d2 | | f1 | f2 | f3 | | | |
| S01(*) | - | Nb | - | 0.500 | 0.500 | 0 | 0 | 0 | 1.00 | 1.000 | 0 | 0 | 0 | 0 | 0 |
| S24 | Ca, Ba | Nb, Ti, Zr | Co | 0.488 | 0.409 | 0.027 | 0.026 | 0.050 | 0.800 | 0.953 | 0.022 | 0.025 | 0.008 | 1.40 | Co |
| S25 | Ca, Ba | Nb, Ti, Zr | Co | 0.488 | 0.409 | 0.027 | 0.026 | 0.050 | 0.880 | 0.953 | 0.022 | 0.025 | 0.008 | 1.40 | Co |
| S26 | Ca, Ba | Nb, Ti, Zr | Co | 0.488 | 0.409 | 0.027 | 0.026 | 0.050 | 0.940 | 0.953 | 0.022 | 0.025 | 0.008 | 1.40 | Co |
| S27 | Ca, Ba | Nb, Ti, Zr | Co | 0.488 | 0.409 | 0.027 | 0.026 | 0.050 | 0.980 | 0.953 | 0.022 | 0.025 | 0.008 | 1.40 | Co |
| S28(S13) | Ca, Ba | Nb, Ti, Zr | Co | 0.488 | 0.409 | 0.027 | 0.026 | 0.050 | 1.000 | 0.953 | 0.022 | 0.025 | 0.008 | 1.40 | Co |
| S29 | Ca, Ba | Nb, Ti, Zr | Co | 0.488 | 0.409 | 0.027 | 0.026 | 0.050 | 1.030 | 0.953 | 0.022 | 0.025 | 0.008 | 1.40 | Co |
| S30 | Ca, Ba | Nb, Ti, Zr | Co | 0.488 | 0.409 | 0.027 | 0.026 | 0.050 | 1.070 | 0.953 | 0.022 | 0.025 | 0.008 | 1.40 | Co |
| S31 | Ca, Ba | Nb, Ti, Zr | Co | 0.488 | 0.409 | 0.027 | 0.026 | 0.050 | 1.100 | 0.953 | 0.022 | 0.025 | 0.008 | 1.40 | Co |

First crystal phase (Main phase): $(K_aNa_bLi_cC_d)_e(D_fE_g)O_h$
(where the element C includes one or more elements selected from the group consisting of Ca, Sr, and Ba, the element D includes one or more elements selected from the group consisting of Nb, Ta, Ti, and Zr while including at least Nb or Ta, and the element E includes one or more elements selected from the group consisting of Co, Zn, Fe, Al, Mn, Mg, Ni, Y, Sc, and Ga, where $a + b + c + d = 1$, e is arbitrary, $f + g = 1$, and h is an arbitrary value that forms perovskite.)

Second crystal phase (Subphase): $M_xTiO_y$
(where the element M includes one or more elements selected from the group consisting of Li, Co, Zn, Mg, Ni, Fe, Al, Y, Sc, Ga, Mn, and Zr, and where the coefficients x and y are relative values with respect to the Ti content, $0.5 \leq x \leq 5.0$, and the coefficient y is an arbitrary value that forms spinel.)

(*) indicates a comparative example.

FIG. 16B

Influence of coefficient e of first crystal phase (main phase) (No.2)

| Sample | First crystal phase (Main phase) | | Second crystal phase (Subphase) | | Relative permittivity | Piezoelectric constant | Electro-mechanical coupling coefficient |
|---|---|---|---|---|---|---|---|
| | Composition | e | Subphase rate (Vol%) | Element M | $\varepsilon_{33}{}^T/\varepsilon_0$ | $d_{33}$(pC/N) | kr |
| S01(*) | FIG. 14A | 1.00 | 0.0 | - | 430 | 90 | 0.30 |
| S 24 | do. | 0.80 | 1.40 | Co | 890 | 103 | 0.28 |
| S 25 | do. | 0.88 | 1.40 | Co | 1400 | 205 | 0.40 |
| S 26 | do. | 0.94 | 1.40 | Co | 1430 | 220 | 0.42 |
| S 27 | do. | 0.98 | 1.40 | Co | 1560 | 255 | 0.48 |
| S28(S13) | do. | 1.00 | 1.40 | Co | 1772 | 283 | 0.51 |
| S 29 | do. | 1.03 | 1.40 | Co | 1620 | 244 | 0.46 |
| S 30 | do. | 1.07 | 1.40 | Co | 1540 | 232 | 0.45 |
| S 31 | do. | 1.10 | 1.40 | Co | 1500 | 98 | 0.26 |

First crystal phase (Main phase): $(K_aNa_bLi_cC_d)_e(DE_g)O_h$
(where the element C includes one or more elements selected from the group consisting of Ca, Sr, and Ba, the element D includes one or more elements selected from the group consisting of Nb, Ta, Ti, and Zr while including at least Nb or Ta, and the element E includes one or more elements selected from the group consisting of Co, Zn, Fe, Al, Mn, Mg, Ni, Y, Sc, and Ga, where a + b + c + d = 1, e is arbitrary, f + g = 1, and h is an arbitrary value that forms perovskite.)

Second crystal phase (Subphase): $M_xTiO_y$
(where the element M includes one or more elements selected from the group consisting of Li, Co, Zn, Mg, Ni, Fe, Al, Y, Sc, Ga, Mn, and Zr, and where the coefficients x and y are relative values with respect to the Ti content, $0.5 \leq x \leq 5.0$, and the coefficient y is an arbitrary value that forms spinel.)

(*) indicates a comparative example.

UNLEADED PIEZOELECTRIC CERAMIC COMPOSITION, PIEZOELECTRIC ELEMENT USING SAME, DEVICE, AND METHOD FOR MANUFACTURING UNLEADED PIEZOELECTRIC CERAMIC COMPOSITION

CROSS REFERENCE TO RELATED APPLICATIONS

This application is a National Stage of International Application No. PCT/JP2014/001358 filed Mar. 11, 2014, claiming priority to Japanese Patent Application No. 2013-71778 filed on Mar. 29, 2013, the contents of all of which are incorporated herein by reference in their entirety.

TECHNICAL FIELD

The present invention relates to a lead-free piezoelectric ceramic composition used for a piezoelectric element and the like, a variety of devices using the lead-free piezoelectric ceramic composition, and a process for production of the lead-free piezoelectric ceramic composition.

BACKGROUND ART

The majority of conventionally mass-produced piezo ceramics are made from PZT (lead zirconate titanate) materials and thus contain lead. However, In recent years, the development of lead-free piezoelectric ceramics has been desired in order to eliminate the adverse influence of lead on the environment. As materials for the lead-free piezoelectric ceramics (referred to as "lead-free piezoelectric ceramic compositions"), compositions represented by the compositional formula: $ANbO_3$ (where A is an alkali metal) such as potassium sodium niobate $((K,Na)NbO_3)$ are proposed. However, the lead-free $ANbO_3$ piezoelectric ceramic compositions themselves have a problem of inferior sinterability and humidity resistance.

As a measure against this problem, Patent Document 1 described below discloses a technique of adding Cu, Li, Ta, or the like to the lead-free $ANbO_3$ piezoelectric ceramic compositions in order to improve sinterability and to eventually improve piezoelectric properties.

In addition, Patent Document 2 discloses a lead-free piezoelectric ceramic composition represented by the general formula: $\{Li_x(K_{1-y}Na_y)_{1-x}\}(Nb_{1-z}Sb_z)O_3$ (where $0 \leq x \leq 0.2$; $0 \leq y \leq 1.0$; and $0 \leq z \leq 0.2$ except for the case of $x=z=0$) and capable of achieving relatively good sinterability and piezoelectric properties.

CITATION LIST

Patent Literature

Patent Document 1: JP-A-2000-313664
Patent Document 2: JP-A-2003-342069
Patent Document 3: WO/2011/093021

SUMMARY OF THE INVENTION

Problem that the Invention is to Solve

However, while being improved in sinterability, the piezoelectric ceramic composition described in Patent Document 1 is inferior in piezoelectric properties in comparison with the conventional lead-containing piezoelectric ceramic compositions and thus does not attain sufficient practicality. Meanwhile, while demonstrating a relatively high piezoelectric constant, the piezoelectric ceramic composition described in Patent Document 2 has a problem of showing abrupt property change above and below its phase transition point between −50° C. and +150° C.

Patent Document 3 disclosed by the present applicant discloses a lead-free piezoelectric ceramic composition including a first crystal phase made of an alkali niobate/tantalate type perovskite oxide and a second crystal phase made of an A-Ti—B—O composition oxide (where the element A is an alkali metal, the element B is at least one of Nb and Ta, and none of the contents of the element A, the element B, and Ti is zero). The lead-free piezoelectric ceramic composition has excellent properties of having excellent piezoelectric properties and showing no abrupt property change between −50° C. and +150° C. However, further improvements in piezoelectric properties have been desired.

Means for Solving the Problem

The present invention has been made to solve the above-described problems and can be embodied in the following aspects.

(1) According to one aspect of the present invention, a lead-free piezoelectric ceramic composition can be provided. The lead-free piezoelectric ceramic composition comprises: a main phase comprising a first crystal phase comprising an alkali niobate/tantalate type perovskite oxide having piezoelectric properties; and a subphase comprising a second crystal phase comprising an M-Ti—O spinel compound (where the element M is a monovalent to quadrivalent element).

According to the lead-free piezoelectric ceramic composition, the second crystal phase made of the spinel compound stabilizes the structure of the first crystal phase, so that it is possible to provide the lead-free piezoelectric ceramic composition with excellent piezoelectric properties and insulation properties.

(2) In the above-described lead-free piezoelectric ceramic composition, the element M may comprise at least one metallic element selected from the group consisting of Li, Mg, Al, Sc, Cr, Mn, Fe, Co, Ni, Zn, Ga, Y, and Zr.

According to this configuration, the spinel compound having a stable structure can be obtained as the second crystal phase. As a result, it is possible to provide the lead-free piezoelectric ceramic composition with excellent piezoelectric properties.

(3) In the above-described lead-free piezoelectric ceramic composition, the M-Ti—O spinel compound may be represented by a compositional formula: $M_xTiO_y$ (where the coefficients x and y are relative values when a content of Ti is taken as 1), and the coefficient x may satisfy $0.5 \leq x \leq 5.0$.

According to this configuration, the spinel compound having a stable structure can be obtained as the second crystal phase. As a result, it is possible to provide the lead-free piezoelectric ceramic composition with excellent piezoelectric properties.

(4) In the above-described lead-free piezoelectric ceramic composition, the coefficient y may satisfy $2 \leq y \leq 8$.

According to this configuration, the spinel compound having a stable structure can be obtained as the second crystal phase. As a result, it is possible to provide the lead-free piezoelectric ceramic composition with excellent piezoelectric properties.

(5) In the above-described lead-free piezoelectric ceramic composition, the subphase may fill a hole formed in the main phase.

According to the lead-free piezoelectric ceramic composition, the subphase fills the hole in the main phase to stabilize the structure of the main phase (first crystal phase), so that it is possible to provide the lead-free piezoelectric ceramic composition with excellent piezoelectric properties.

(6) In the above-described lead-free piezoelectric ceramic composition, the contained rate of the second crystal phase in the lead-free piezoelectric ceramic composition may be any one of: (i) 0.5 vol % to 5.0 vol %; (ii) 0.5 vol % to 2.5 vol %; and (iii) 1.0 vol % to 2.0 vol %.

According to this configuration, it is possible to further improve piezoelectric properties and insulation properties of the lead-free piezoelectric ceramic composition.

(7) In the above-described lead-free piezoelectric ceramic composition, the M-Ti—O spinel compound may comprise two or more metallic elements as the element M.

According to this configuration, it is possible to further improve the properties of the lead-free piezoelectric ceramic composition.

(8) In the above-described lead-free piezoelectric ceramic composition, the subphase may comprise a third crystal phase in addition to the second crystal phase, the third crystal phase comprising an $A_3B_5O_{15}$ type compound (where the element A is a monovalent to divalent metal, and the element B is a divalent to pentavalent metal).

According to this configuration, the structure of the second crystal phase is stabilized by the third crystal phase, which can stabilize the lead-free piezoelectric ceramic composition.

(9) In the above-described lead-free piezoelectric ceramic composition, a volume rate of the second crystal phase may be 50% or more when the entire subphase is taken as 100%.

According to this configuration, the effect of stabilization of the structure of the first crystal phase by the second crystal phase becomes pronounced, so that it is possible to further improve the properties of the lead-free piezoelectric ceramic composition.

(10) In the above-described lead-free piezoelectric ceramic composition, the alkali niobate/tantalate type perovskite oxide of the first crystal phase may comprise an alkali earth metal.

According to this configuration, it is possible to obtain the lead-free piezoelectric ceramic composition with excellent piezoelectric properties.

(11) In the above-described lead-free piezoelectric ceramic composition, the alkali niobate/tantalate type perovskite oxide of the first crystal phase may be represented by a compositional formula: $(K_aNa_bLi_cC_d)_e(D_fE_g)O_h$ (where the element C comprises one or more elements selected from the group consisting of Ca, Sr, and Ba, the element D comprises one or more elements selected from the group consisting of Nb, Ta, Ti, Zr, Hf, Sn, Sb, and Si while comprising at least Nb or Ta, and the element E comprises one or more elements selected from the group consisting of Mg, Al, Sc, Mn, Fe, Co, Ni, Zn, Ga, and Y, and where a+b+c+d=1, e is arbitrary, f+g=1, and h is an arbitrary value that forms perovskite).

According to this configuration, it is possible to improve the properties of the lead-free piezoelectric ceramic composition.

(12) In the above-described lead-free piezoelectric ceramic composition, the coefficient e may satisfy $0.88 \leq e \leq 1.07$.

According to this configuration, it is possible to further improve the properties of the lead-free piezoelectric ceramic composition.

(13) In the above-described lead-free piezoelectric ceramic composition, the alkali niobate/tantalate type perovskite oxide may comprise an alkali niobate type perovskite oxide.

According to this configuration, it is possible to provide the lead-free piezoelectric ceramic composition having a higher Curie temperature (Tc) in comparison with the case where the alkali niobate/tantalate type perovskite oxide is an alkali tantalate type perovskite oxide.

(14) According to another aspect of the present invention, there is provided a piezoelectric element, comprising: a piezoelectric ceramic comprising the above-described lead-free piezoelectric ceramic composition; and an electrode mounted on the piezoelectric ceramic.

(15) According to still another aspect of the present invention, there is provided a device comprising the piezoelectric element.

(16) The above-described device may comprise any one of a knock sensor, an ultrasonic transducer, a cutting tool, an ultrasonic sensor, and an actuator.

(17) According to another aspect of the present invention, a process for production of the above-described lead-free piezoelectric ceramic composition is provided. The process comprises: preparing a first powder by mixing and calcining raw materials of the first crystal phase; preparing a second powder by mixing and calcining raw materials of the second crystal phase; and producing the lead-free piezoelectric ceramic composition by mixing the first and second powders, molding the mixed powder material into a green body, and then firing the green body, wherein the firing comprises sealed firing that is performed by sealing the green body in a closed container.

According to this process, it is possible to produce the lead-free piezoelectric ceramic composition with excellent piezoelectric properties that includes the first crystal phase made of the alkali niobate/tantalate type perovskite oxide having piezoelectric properties and the second crystal phase made of the M-Ti—O spinel compound.

The present invention can be achieved in different forms, for example, in the forms of a lead-free piezoelectric ceramic composition, a piezoelectric element using the lead-free piezoelectric ceramic composition, a variety of devices including the piezoelectric element (e.g., a knock sensor, an ultrasonic transducer, a cutting tool, an ultrasonic sensor, and an actuator), and a process for production of the lead-free piezoelectric ceramic composition, and the like.

BRIEF DESCRIPTION OF THE DRAWINGS

FIG. 8A A view of experimental results relating to the influence of a subphase rate on piezoelectric properties.

FIG. 8B A view of experimental results relating to the influence of a subphase rate on piezoelectric properties.

FIG. 10 A view showing reflected electron images of samples S01 and S06.

FIG. 11A A view of experimental results relating to the influence of the type of a metallic element M of a subphase on the properties of a piezoelectric ceramic composition (No. 1).

FIG. 11B A view of experimental results relating to the influence of the type of a metallic element M of a subphase on the properties of a piezoelectric ceramic composition (No. 1).

FIG. 12A A view of experimental results relating to the influence of the type of a metallic element M of a subphase on the properties of a piezoelectric ceramic composition (No. 2).

FIG. 12B A view of experimental results relating to the influence of the type of a metallic element M of a subphase on the properties of a piezoelectric ceramic composition (No. 2).

FIG. 12C A view of experimental results relating to the influence of the type of a metallic element M of a subphase on the properties of a piezoelectric ceramic composition (No. 2).

FIG. 12D A view of experimental results relating to the influence of the type of a metallic element M of a subphase on the properties of a piezoelectric ceramic composition (No. 2).

FIG. 13 A view of experimental results relating to the influence of a subphase rate on insulation properties.

FIG. 14 A view of experimental results on high-temperature endurance.

FIG. 15 A view of results of a thermal cycle test.

FIG. 16A A view of experimental results relating to the influence of a coefficient e in a compositional formula of a first crystal phase on the properties of a piezoelectric ceramic composition.

FIG. 16B A view of experimental results relating to the influence of a coefficient e in a compositional formula of a first crystal phase on the properties of a piezoelectric ceramic composition.

MODE FOR CARRYING OUT THE INVENTION

Figure 1:
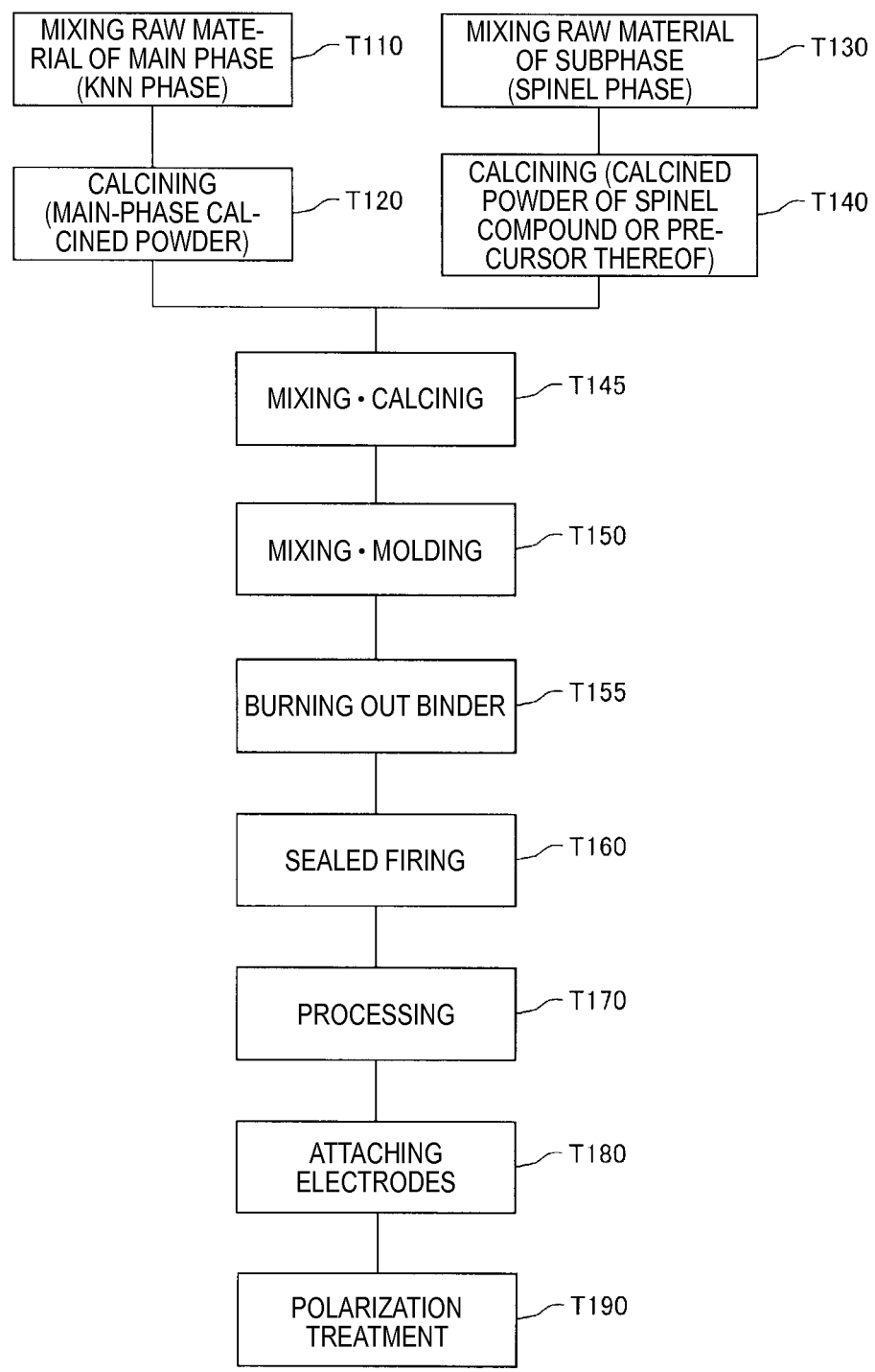
FIG. 1 A flow chart of a process for production of a piezoelectric element according to one aspect of the present invention.

A piezoelectric ceramic composition according to one aspect of the present invention defines a lead-free piezoelectric ceramic composition including a main phase consisting of a first crystal phase made of an alkali niobate/tantalate type perovskite oxide having piezoelectric properties and a subphase consisting of a second crystal phase made of an M-Ti—O spinel compound. In the present description, a "spinel compound" includes both of a normal spinel compound having a normal spinel crystal structure and an inverse spinel compound having an inverse spinel crystal structure. In the typical lead-free piezoelectric ceramic composition according to the one aspect, the element M in the M-Ti—O spinel compound is a monovalent to quadrivalent element. In addition, the rate of the second crystal phase in the lead-free piezoelectric ceramic composition is more than 0 vol % to 10 vol %, and the balance is the first crystal phase. Hereinafter, the first crystal phase is referred to also as the "main phase" and the crystal phases other than the main phase are referred to as the "subphases". In addition, the second crystal phase is referred to also as the "spinel structure phase" or the "spinel phase". The subphases including the second crystal phase stabilize the crystal structure of the first crystal phase by existing mixed with the first crystal phase, and thereby the piezoelectric properties are improved. In addition, the second crystal phase has the function of preventing abrupt property change resulting from the phase transition point being between −50° C. and +150° C. It is to be noted that the piezoelectric ceramic composition may include a crystal phase (e.g., a third crystal phase) other than the second crystal phase as the subphase.

It is preferable that the perovskite oxide that forms the first crystal phase should contain at least one of an alkali niobate type perovskite oxide and an alkali tantalate type perovskite oxide. The word an "alkali niobate/tantalate type perovskite oxide" is a general term for plural kinds of these perovskite oxides. The alkaline component in the alkali niobate/tantalate type perovskite oxide contains at least an alkali metal (e.g., K (potassium), Na (sodium), and Li (lithium)), and may contain an alkali earth metal (e.g., Ca (calcium), Sr (strontium), and Ba(barium)). Preferably used as the above-described alkali niobate/tantalate type perovskite oxide are those represented by the following compositional formula.

<Favorable Compositional Formula of First Crystal Phase>

$(K_aNa_bLi_cC_d)_e(D_fE_g)O_h$ (1)

Herein, the element C defines at least one or more elements selected from the group consisting of Ca (calcium), Sr (strontium), Ba(barium), the element D defines one or more elements selected from the group consisting of Nb (niobium), Ta (tantalum), Ti (titanium), Zr (zirconium), Hf (hafnium), Sn (tin), Sb (antimony), and Si (silicon) while including at least Nb or Ta, and the element E is one or more elements selected from the group consisting of Mg (magnesium), Al (aluminum), Sc (scandium), Mn (manganese), Fe (iron), Co (cobalt), Ni (nickel), Zn (zinc), Ga (gallium), and Y (yttrium), where a+b+c+d=1, e is arbitrary, f+g=1, and h is an arbitrary value that forms perovskite.

When the element C may consist of one to two elements and each of the elements D and E may consist of one to three elements in above-described compositional formula (1), compositional formula (1) can be rewritten as the following compositional formula (1a).

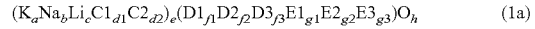

$(K_aNa_bLi_cC1_{d1}C2_{d2})_e(D1_{f1}D2_{f2}D3_{f3}E1_{g1}E2_{g2}E3_{g3})O_h$ (1a)

where a+b+c+d1+d2=1, e is arbitrary, f1+f2+f3+g1+g2+g3=1, and h is an arbitrary value that forms perovskite. The compositional formula (1a) is equivalent to above-described compositional formula (1). As is seen from this example, when the element C consists of two metallic elements, the coefficient d of the element C is expressed by a sum of the coefficients d1 and d2 of the two elements C1 and C2. In addition, when the element D consists of three metallic elements, the coefficient f of the element D is expressed by a sum of the coefficients f1, f2, and f3 of the three elements D1, D2, and D3. The same can be applied to a case when the element D consists of four or more metallic elements.

In compositional formula (1), K (potassium), Na (sodium), Li (lithium), and the element C (Ca, Sr, Ba) are disposed at a so-called A-site in a perovskite structure. In addition, the element D (one or more elements selected from the group consisting of Nb, Ta, Ti, Zr, Hf, Sn, Sb, and Si while including at least Nb or Ta) and the element E (one or more elements selected from the group consisting of Mg, Al, Sc, Mn, Fe, Co, Ni, Zn, Ga, and Y) are disposed at a so-called B-site in the perovskite structure. It is preferable that the sum of the first three coefficients (a+b+c) among the coefficients a, b, c, and d of the elements at the A-site should not be zero while the coefficient d may be zero. It is preferable that among the coefficients f and g of the elements D and E at the B-site, the coefficient f of the element D should not be zero while the coefficient e may be zero. To be specific, it is preferable that the alkali niobate/tantalate type perovskite oxide according to the present aspect should define a perovskite oxide that contains at least one alkali metal (K, Na, Li) and may contain an alkaline earth metal (Ca, Sr, Ba) at the A-site, while containing one or more metals selected from the group consisting of Nb, Ta, Ti, Zr, Hf, Sn, Sb, and Si while containing at least Nb or Ta and may contain one or more other metals (Mg, Al, Sc, Mn, Fe, Co, Ni, Zn, Ga, and Y) at the B-site. In addition, the constituent element at the B-site preferably consists of Nb. The alkali niobate type perovskite oxide that contains Nb is preferable in being capable of providing a lead-free piezoelectric ceramic composition having a higher Curie temperature (Tc) in comparison with an alkali tantalate type perovskite oxide that contains no Nb.

The values of the coefficients a, b, c, d, e, f, g, and h in above-described compositional formula (1) can be preferably selected, in view of the electrical properties or piezoelectric properties (in particular, a piezoelectric constant $d_{33}$) of the lead-free piezoelectric ceramic composition, from various possible combinations of values that can form a perovskite structure. To be specific, it is preferable that each of the coefficients a, b, and c should be 0 to less than 1, and a=b=c=0 (that is, a piezoelectric ceramic composition containing none of K, Na, and Li) should not be satisfied. The coefficients a and b for K and Na typically satisfy 0<a≤0.6 and 0<b≤0.6. The coefficient c for Li may be zero; however, 0<c≤0.2 is preferable, and 0<c≤0.1 is more preferable. The coefficient d for C (one or more of Ca, Sr, and Ba) may be zero; however, 0<d≤0.2 is preferable, and 0<d≤0.1 is more preferable. The coefficient e for the entire A-site is arbitrary; however, 0.80≤e≤1.10 is preferable, 0.84≤e≤1.08 is more preferable, and 0.88≤e≤1.07 is most preferable. The coefficient h for oxygen can take an arbitrary value such that the first crystal phase forms a perovskite oxide. Typically, the coefficient h is about 3, and 3.0≤h≤3.1 is preferable. It is to be noted that the coefficient h can be calculated based on the electrical neutralization conditions of the composition of the first crystal phase. However, a composition having electrical neutralization conditions that are not slightly met is permissible as the composition of the first crystal phase.

A typical example of the composition of the first crystal phase is $(K, Na, Li, Ca, Ba)_e (Nb, Ti, Zr) O_h$, where the first crystal phase contains K, Na, and Nb as its main metallic components. Because the first crystal phase contains K, Na and Nb as its main metallic components, a material made of the first crystal phase is referred to also as "KNN" or the "KNN material", and the first crystal phase is referred to also as the "KNN phase". Making the first crystal phase of the KNN phase can provide a lead-free piezoelectric ceramic composition that is excellent in piezoelectric properties, electric properties, insulation properties, and high-temperature endurance, and shows no abrupt property change between −50° C. and +150° C.

Preferably used as the M-Ti—O spinel compound of the second crystal phase are those represented by the following compositional formula.

<Favorable Compositional Formula of Second Crystal Phase>

Herein, the element M is a monovalent to quadrivalent metallic element and is at least one element selected from the group consisting of Li (lithium), Mg (magnesium), Al (aluminum), Sc (scandium), Cr (chrome), Mn (manganese), Fe (iron), Co (cobalt), Ni (nickel), Zn (zinc), Ga (gallium), Y (yttrium), Zr (zirconium), Sn (tin), Sb (antimony), Si (silicon), and Hf (hafnium). It is to be noted that when Li is contained as the element M, it is preferable that one or more metallic elements other than Li selected from the above-described metallic elements should be contained together with Li in order that the second crystal phase may form a spinel compound. The coefficients x and y are relative values when the content of Ti is taken as 1. It is preferable that the coefficient x should satisfy 0.5≤x≤5.0 in order that the second crystal phase may form the spinel compound. In addition, while the coefficient y is an arbitrary value that forms the spinel compound, a typical value thereof preferably satisfies 2≤y≤8.0. The second crystal phase made of the spinel compound stabilizes the structure of the first crystal phase, so that it is possible to provide the piezoelectric ceramic composition with excellent piezoelectric properties. It is to be noted that in terms of piezoelectric properties, it is preferable to use a second crystal phase represented by the compositional formula: $M_2TiO_4$ or $(M1, M2)TiO_4$ containing two divalent metallic elements.

In particular, a piezoelectric ceramic composition containing two or more metallic elements as the element M is favorable. In the present description, the spinel compound containing two or more metallic elements as the element M is referred to also as the "composition spinel compound". When the second crystal phase contains the composition spinel compound, the properties of the lead-free piezoelectric ceramic composition can be improved.

To be specific, the variety of following spinel compounds can be used for the second crystal phase.
(1) Examples of Spinel Compound Containing Li
$LiAlTiO_4$, $LiCrTiO_4$, $LiFeTiO_4$, $LiGaTiO_4$, $LiMnTiO_4$, $LiYTiO_4$, $LiScTiO_4$, $LiCo_{0.5}Ti_{1.5}O_4$, $LiMg_{0.5}Ti_{1.5}O_4$, $LiMn_{0.5}Ti_{1.5}O_4$, $LiZn_{0.5}Ti_{1.5}O_4$, $Li_{1.33}(Zr, Ti)_{1.67}O_4$
(2) Examples of spinel compound containing Co
$Co_2TiO_4$, $CoZnTiO_4$, $CoMgTiO_4$, $CoNiTiO_4$, $CoFeTiO_4$, $CoMnTiO_4$
(3) Examples of spinel compound containing Zn
$Zn_2TiO_4$, $ZnMgTiO_4$, $ZnNiTiO_4$, $ZnFeTiO_4$, $ZnMnTiO_4$
(4) Examples of spinel compound containing Mg
$Mg_2TiO_4$, $MgNiTiO_4$, $MgFeTiO_4$, $MgMnTiO_4$
(5) Examples of spinel compound containing Ni
$Ni_2TiO_4$, $NiFeTiO_4$, $NiMnTiO_4$, $Ni_{1.5}FeTi_{0.5}O_4$, $Ni_2(Ti,Zr)O_4$
(6) Examples of spinel compound containing Fe
$Fe_2TiO_4$, $FeMnTiO_4$, $Mn_{1.5}FeTi_{0.5}O_4$
(7) Examples of spinel compound containing Mn
$Mn_2TiO_4$
(8) Examples of favorable spinel compound
It is particularly preferable that the M-Ti—O spinel compound of the second crystal phase should contain one or more compounds selected from $NiFeTiO_4$, $MgFeTiO_4$, $Ni_2(Ti, Zr)O_4$, $Ni_{1.5}FeTi_{0.5}O_4$, $CoMgTiO_4$, $CoFeTiO_4$, and $(Fe, Zn, Co)TiO_4$.

It is to be noted that the above-described compositional formulae of the variety of spinel compounds are not strictly defined, so that compositional formulae obtained by actual analyses could be slightly different therefrom. For example, there is a sample obtained as a result of analysis by the present inventors, the sample being $Mg_{1.1}Fe_{1.55}TiO_y$, obtained as a compositional formula by analysis of $MgFeTiO_4$. The same can be applied to other compounds. However, the compositional formulae obtained by the actual analyses are not different in satisfying the above-described compositional formula (2) ($M_xTiO_y$), and have a commonality in being a compositional formula representing a titanate compound having a spinel structure.

The spinel compound that forms the second crystal phase may be a normal spinel crystal structure or may be an inverse spinel compound. It is to be noted that whether or not the second crystal phase is a spinel compound can be determined by performing Rietveld Analysis using a diffraction result of X-ray powder diffraction (XRD). Analyses of the amounts of the metallic elements other than Li in the spinel compound can be performed using an electron probe microanalyzer (EPMA) or an energy dispersive X-ray analyzer (TEM-EDS). In addition, analysis of the Li amount can be performed using a time-of-flight secondary ion mass spectrometer (TOF-SIMS).

While not having piezoelectric properties, the above-described second crystal phase can improve the sinterability of the piezoelectric ceramic composition by existing mixed with the first crystal phase to improve the structure stability and the piezoelectric properties of the piezoelectric ceramic composition. To be specific, the second crystal phase fills holes formed between microscopic crystals in the first crystal phase. It is considered that the microscopic crystals in the first crystal phase are thus bound together by the second crystal phase, which can improve the structure stability to improve the piezoelectric properties of the piezoelectric ceramic composition. In addition, it is considered that the second crystal phase contributes to the function of not bringing the phase transition point between −50° C. and +150° C.

It is to be noted that in the above-described Patent Document 3 (WO/2011/093021) disclosed by the present applicant, the second crystal phase does not form a spinel compound, but forms a layer structure compound. Meanwhile, because the second crystal phase is a spinel compound in the present aspect of the present invention, a piezoelectric ceramic composition that is more excellent in structure stability and piezoelectric properties than the piezoelectric ceramic composition of Patent Document 3 can be provided.

In terms of the piezoelectric properties of the piezoelectric ceramic composition, the contained rate of the second crystal phase is preferably (i) 0.5 vol % to 5.0 vol %, more preferably (ii) 0.5 vol % to 2.5 vol %, and most preferably (iii) 1.0 vol % to 2.0 vol %. A piezoelectric ceramic composition that contains no second crystal phase (a composition containing only the first crystal phase) tends to show abrupt property change between −50° C. and +150° C. In addition, a piezoelectric ceramic composition of which the contained rate of a second crystal phase is less than 0.5 vol % or a piezoelectric ceramic composition of which the contained rate of a second crystal phase is more than 5.0 vol % are likely to be inferior in piezoelectric properties (especially in a piezoelectric constant $d_{33}$ or an electromechanical coupling coefficient kr).

The subphase of the piezoelectric ceramic composition may include a crystal phase (e.g., a third crystal phase) other than the second crystal phase. For example, a crystal phase of an $A_3B_5O_{15}$ type compound (where the element A is a monovalent to divalent metal, and the element B is a divalent to pentavalent metal) is preferably used for the third crystal phase. An $A_3B_5O_{15}$ type compound where the element A (a monovalent to divalent metal) is at least one of Ba, Ca, Sr, Na, K, and Li and the element B (a divalent to pentavalent metal) is at least one of Nb, Mn, Fe, Ni, Co, Zn, and Zr can be used. As a specific example, $(Ba, Na, K)_3(Nb, Ni, Fe)_5O_{15}$, $(Ba, Na, K)_3(Nb, Co, Ni)_5O_{15}$, $(Ba, Na, K)_3(Nb, Zn)_5O_{15}$, $(Ba, Na, K)_3(Nb, Mn)_5O_{15}$, and $(Ba, Na, K)_3(Nb, Fe, Zn, Co)_5O_{15}$ can be used. Existence of such a third crystal phase allows the spinel compound that defines the second crystal phase not to be easily converted. Thus, it is considered that stabilization of the spinel compound can be promoted to improve stability of the entire piezoelectric ceramic composition. It is to be noted that also when the subphase includes a crystal phase other than the second crystal phase, the volume rate of the second crystal phase is preferably 50% or more, more preferably 70% or more, and most preferably 80% or more when the entire subphase is taken as 100%. This is because when the rate of the second crystal phase is too small, the effect of the second crystal phase's stabilizing the first crystal phase becomes insufficient. It is to be noted that also when the subphase includes a crystal phase (e.g., a third crystal phase) other than the second crystal phase, the subphase fills holes formed between microscopic crystals in the first crystal phase.

FIG. 1 is a flow chart of a process for production of a piezoelectric element according to one aspect of the present invention. In step T110, any required materials are selected as raw materials of the first crystal phase (the main phase) among $K_2CO_3$ powder, $Na_2CO_3$ powder, $Li_2CO_3$ powder, $CaCO_3$ powder, $SrCO_3$ powder, $BaCO_3$ powder, $Nb_2O_5$ powder, $Ta_2O_5$ powder, $TiO_2$ powder, $ZrO_2$ powder, MgO powder, $Al_2O_3$ powder, $Sc_2O_3$ powder, $MnO_2$ powder, $Fe_2O_3$ powder, CoO powder, NiO powder, ZnO powder, $Ga_2O_3$ powder, $Y_2O_3$ powder, and the like, and weighed out according to the values of the coefficients a, b, c, d, e, f, and g in the compositional formula of the main phase. Then, a slurry is prepared by adding ethanol to these raw material powders and subjecting the powder mixture to wet mixing by a ball mill for preferably 15 hours or more. In step T120, the slurry is dried to a mixed powder, and then the resulting mixed powder is formed into a main-phase calcined powder by calcining, for example, in the air at 600° C. to 1100° C. for one to ten hours.

In step T130, any required materials are selected as a raw materials of the second crystal phase (the subphase) among $TiO_2$ powder, $Li_2CO_3$ powder, MgO powder, $Al_2O_3$ powder, $Sc_2O_3$ powder, $Cr_2O_3$ powder, $MnO_2$ powder, $Fe_2O_3$ powder, CoO powder, NiO powder, ZnO powder, $Ga_2O_3$ powder, $Y_2O_3$ powder, $ZrO_2$ powder, and the like, and weighed out according to the value of the coefficient x in the compositional formula of the subphase. In producing a piezoelectric ceramic composition of which a subphase includes a third crystal phase (e.g., an $A_3B_5O_{15}$ type compound), a metal-oxide powder that defines a raw material of the third piezoelectric ceramic may be mixed as appropriate in this step T130 or step T145 to be described later. Then, a slurry is prepared by adding ethanol to these raw material powders and subjecting the powder mixture to wet mixing by a ball mill for preferably 15 hours or more. In step T140, the slurry is dried to a mixed powder, and then the resulting mixed powder is formed into a subphase calcined powder by calcining, for example, in the air at 600° C. to 1100° C. for one to ten hours. This subphase calcined powder is a powder of a spinel compound or a precursor of a spinel compound. While not being a spinel compound yet after the calcining in step T140, the precursor of a spinel compound is to become a spinel compound by calcining in step T160 to be described later.

In step T145, the main-phase calcined powder and the subphase calcined powder are each weighed out, and then subjected to milling and mixing by a ball mill while a dispersant, a binder, and ethanol are added thereto, and thereby a slurry is prepared. In addition, the slurry is dried to a mixed powder, and then the resulting mixed powder is formed into a calcined powder by calcining, for example, in the air at 600° C. to 1100° C. for one to ten hours. As described below, a favorable rate of the second crystal phase in the piezoelectric ceramic composition is expressed in vol % in the present aspect. Meanwhile, a mixing rate of the main-phase calcined powder and the subphase calcined powder in step T145 is expressed using the weights of the main-phase calcined powder and the subphase calcined powder. At this time, it is possible to empirically predetermine the relation between the subphase rate (mass %) during the mixing in step T145 and the subphase rate (vol %) in the final resulting piezoelectric ceramic composition.

In step T150, the calcined powder obtained in step T145 is subjected again to milling and mixing while a dispersant, a binder, and ethanol are added thereto to prepare a slurry. The thus-obtained slurry is dried using a spray dryer to be granulated, and then is subjected to press working using a uni-axial press, for example, under a pressure of 20 MPa so as to be molded into a desired shape. Typical examples of the shape of a piezoelectric ceramic appropriate for a variety of devices according to the aspect of the present invention include a disk shape, a cylindrical shape, a rectangular flat plate shape, and the like. Then, the resulting molded body is subjected to CIP treatment (cold isostatic press treatment), for example, under a pressure of 150 MPa to prepare a green body. In step T155, the thus-prepared green body is kept, for example, in the air at 500° C. to 800° C. for two to ten hours, and is subjected to a binder-burnout process to burn out the binder. In step T160, the thus-prepared green body after the binder-burnout process is kept to be fired, for example, in the air at a specific temperature (e.g., 1150° C.) selected from 1000° C. to 1300° C. for two to 50 hours, and thereby a piezoelectric ceramic is obtained. The firing in step T160 is preferably sealed firing that is performed by sealing the green body in a closed container. This is because the metallic element such as an alkali metal (Li, Na, K) contained in the green body can be prevented from being dispersed into the outside during the firing. For example, ALUMINASAYA A-1174 produced by OTAKE CERAM CO., LTD. can be used as the closed container. In step T170, the piezoelectric ceramic is processed in accordance with dimensional accuracy required of an piezoelectric element. In step T180, electrodes are attached to the thus-prepared piezoelectric ceramic. In step T190, the thus-prepared piezoelectric element is subjected to polarization treatment.

The above-described production process is merely one example. There can be adopted any other various steps and treatment conditions for production of the piezoelectric element. For example, it is also possible to produce the piezoelectric ceramic composition by mixing the raw materials in accordance with the quantitative rate of the composition of the final resulting piezoelectric ceramic composition and then to fire the mixture, in stead of preparing the main phase powder and the subphase powder separately in advance and then mixing to fire both the powders as shown in FIG. 1. However, using the production process shown in FIG. 1 makes it easier to control the compositions of the main phase and the subphase more strictly, which allows the yield of the piezoelectric ceramic composition to be improved.

Figure 2:
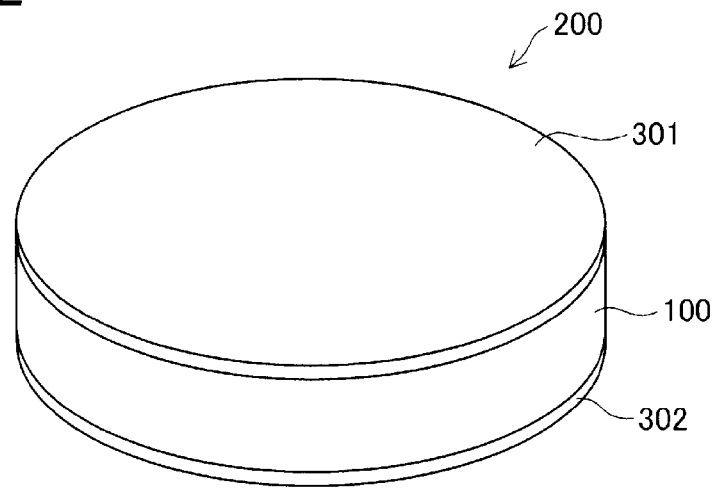
FIG. 2 A perspective view of a piezoelectric element according to one aspect of the present invention.

FIG. 2 is a perspective view of a piezoelectric element according to one aspect of the present invention. The piezoelectric element 200 has a configuration such that electrodes 301 and 302 are mounted on an upper surface and a lower surface of a piezoelectric ceramic 100 having a disk shape. It is to be noted that the piezoelectric element can be formed into a variety of shapes other than this shape.

Figure 3:
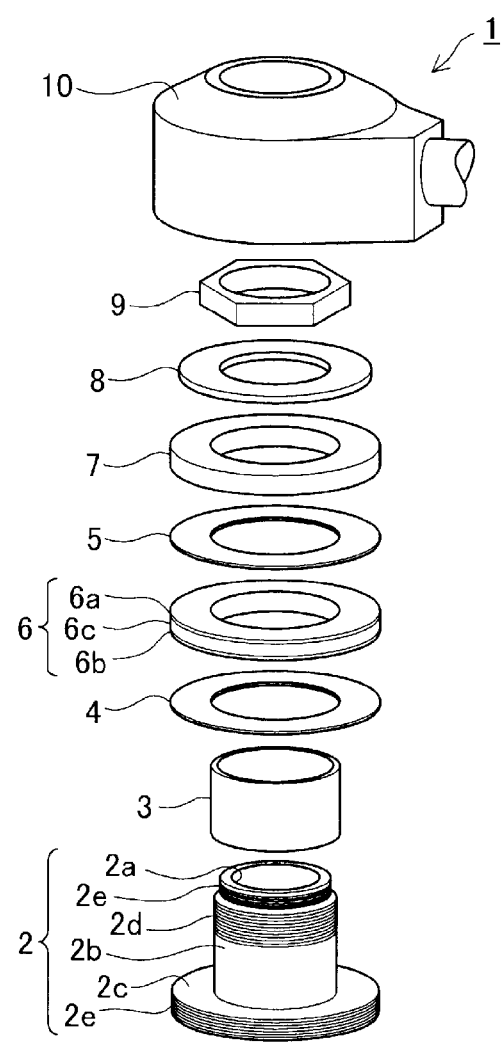
FIG. 3 A perspective view of a knock sensor according to one aspect of the present invention.

FIG. 3 is an exploded perspective view of one example of a knock sensor using the piezoelectric ceramic according to one aspect of the present invention. The knock sensor 1 defines a so-called non-resonant knock sensor, and includes a metal shell 2, an insulating sleeve 3, insulating plates 4 and 5, a piezoelectric element 6, a property-adjusting weight 7, a washer 8, a nut 9, and a housing 10. The metal shell 2 includes a cylindrically-shaped cylinder body 2b having a through-hole 2a penetrating, a doughnut plate-shaped bearing surface 2c protruding in a flange-like manner from the lower-end periphery of the cylinder body 2. In addition, the metal shell 2 includes threads 2d, which is threaded in an upper portion of the cylinder body 2b, and a groove 2e, which is formed on the outer peripheral portion of the bearing surface 2c in order to improve the fitness of the metal shell 2 with the housing 10. It is to be noted that the portions 2a to 2d of the metal shell 2 are of a monolithic construction using any appropriate production process (e.g., casting, forging, and shaving). In addition, the surface of the metal shell 2 is subjected to plating treatment (e.g., zinc chromate plating) for improvement in corrosion resistance.

The insulating sleeve 3 has a thin cylindrical shape and is made from an insulating material (e.g., a variety of plastic materials such as PET and PBT and a rubber material). Each of the insulating plates 4 and 5 has a thin doughnut disk shape and is made from an insulating material (e.g., a variety of plastic materials such as PET and PBT and a rubber material). The piezoelectric element 6 functioning as vibration detecting means includes two sheet electrodes 6a and 6b and a piezoelectric ceramic 6c laminated in-between. The piezoelectric element 6 as a whole has a doughnut disk shape.

The property-adjusting weight 7 has a doughnut disk shape and is made from a material having a given density (e.g., a variety of metal materials such as brass). The insulating sleeve 3 is fitted around the cylindrical portion 2b of the metal shell 2. The insulating plate 4, the piezoelectric element 6, the insulating plate 5, and the property-adjusting weight 7 are fitted in this order on the insulating sleeve 3. In addition, the nut 9 is screwed onto the threads 2d of the cylindrical portion 2b of the metal shell 2 via the washer 8. The insulating plate 4, the piezoelectric element 6, the insulating plate 5, the property-adjusting weight 7, and the washer 8 are thus held between an upper surface of the bearing surface 2c of the metal shell 2 and the nut 9. The housing 10 is made from an insulating material (e.g., a variety of plastic materials such as PA) and is formed by injection molding so as to cover these members 4 to 8. For this reason, only the lower surface of the bearing surface 2c of the metal shell 2 is exposed from the lower end portion of the housing 10 and only the upper end of the cylindrical portion 2b of the metal shell 2 is exposed from the upper end portion of the housing 10. The piezoelectric element 6 is circumferentially surrounded by the insulating sleeve 3, the insulating plates 4 and 5, and the housing 10 and thereby kept insulated from the metal shell 2 and the property-adjusting weight 7. It is to be noted that lead terminals (not illustrated) are each connected to the electrodes 6a and 6b of the piezoelectric element 6 and led out of the housing 10.

The knock sensor 1 can achieve high knocking detection accuracy and heat resistance by the use of the piezoelectric element 6 that has excellent piezoelectric properties and shows no abrupt property change between −50° C. and +150° C.

Figure 4:
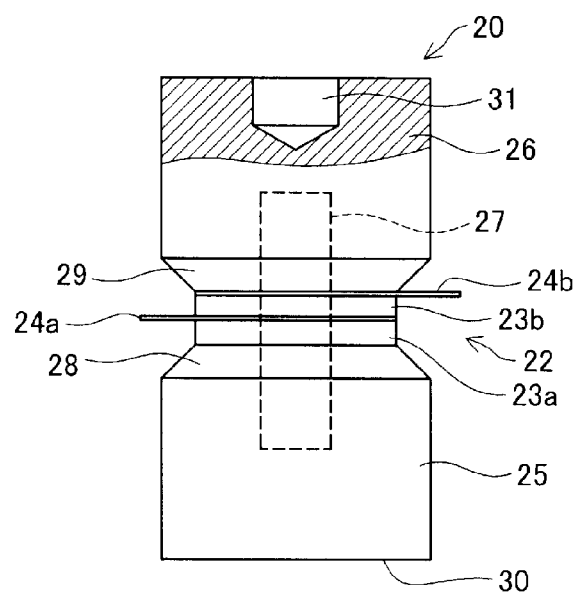
FIG. 4 A vertical cross-sectional view of an ultrasonic transducer according to one aspect of the present invention.

FIG. 4 is a vertical cross-sectional view of an ultrasonic transducer according to one aspect of the present invention. The ultrasonic transducer 20 defines a Langevin type ultrasonic transducer and includes a piezoelectric element pair 22 and a pair of upper and lower front plate 25 and backing plate 26 holding therebetween the piezoelectric element pair 22. The piezoelectric element pair 22 includes two annular piezoelectric elements 23a and 23b, an electrode plate 24a inserted and laminated between the annular piezoelectric elements 23a and 23b, and an electrode plate 24b disposed on the upper annular piezoelectric element 23b. In addition, each of the front plate 25 and the backing plate 26 is made of a cylindrical metal block made from iron or aluminum. The piezoelectric element pair 22 is disposed between the front plate 25 and the backing plate 26. The piezoelectric element pair 22, the front plate 25, and the backing plate 26 are connected to one another by a center bolt 27 so as to be coupled in a monolithic construction.

The front plate 25 and the backing plate 26 are larger in diameter than the piezoelectric elements 23a and 23b. The edges of the front plate 25 and the backing plate 26 that are brought into contact with the piezoelectric elements 23a and 23b are reduced in diameter via conic portions 28 and 29 and are approximately equal in diameter to the piezoelectric elements 23a and 23b. The diameter R2 of the backing plate 26 is approximately equal to the diameter R1 of the front plate 25. The outer end surface of the front plate 25 is defined as an ultrasonic radiation surface 30. In addition, a blind end hole 31 having a diameter R3 is formed in the direction of the axial line in the center of the outer end surface of the backing plate 26. The entire length of the ultrasonic transducer 20 having the above-described configuration is set so as to be approximately equal to a resonant length of three-halves the wavelength of a predetermined resonant frequency.

The ultrasonic transducer can generate ultrasonic waves with a stable frequency and achieve excellent heat resistance by the use of the piezoelectric elements 23a and 23b that have excellent piezoelectric properties and show no abrupt property change between −50° C. and +150° C.

Figure 5:
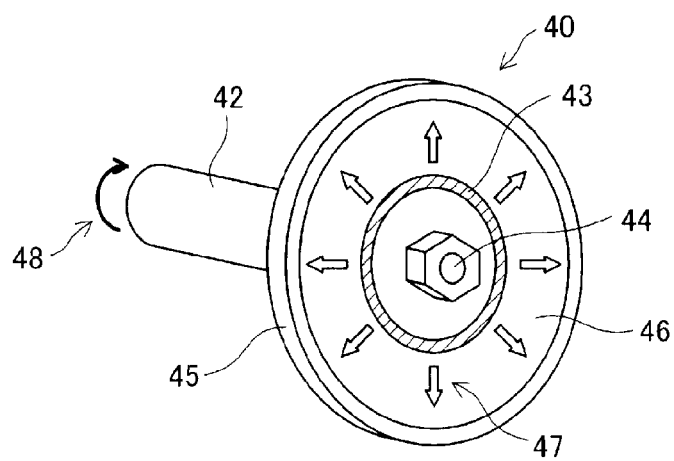
FIG. 5 A perspective view of a cutting tool according to one aspect of the present invention.

FIG. 5 is a perspective view of a cutting tool according to one aspect of the present invention. This cutting tool 40 includes a circular base portion 46 and a grinding portion 45 provided on the outer periphery of the base portion 46. The base portion 46 is fixed at its center to a spindle 42 by a fixing jig 44. Annular piezoelectric elements 43 are embedded in both the surfaces of the base portion 46. A vibration direction of the piezoelectric elements 43 is a radial direction 47 directed from the center toward the outer periphery of the base portion 46. A workpiece can be cut by being pressed against the grinding portion 45 provided on the outer periphery of the base portion 46 in a state where the piezoelectric elements 43 vibrate while the spindle 42 is rotated in a rotation direction 48.

The cutting tool can achieve excellent heat resistance by the use of the piezoelectric elements 43 that have excellent piezoelectric properties and shows no abrupt property change between −50° C. and +150° C.

Figure 6:
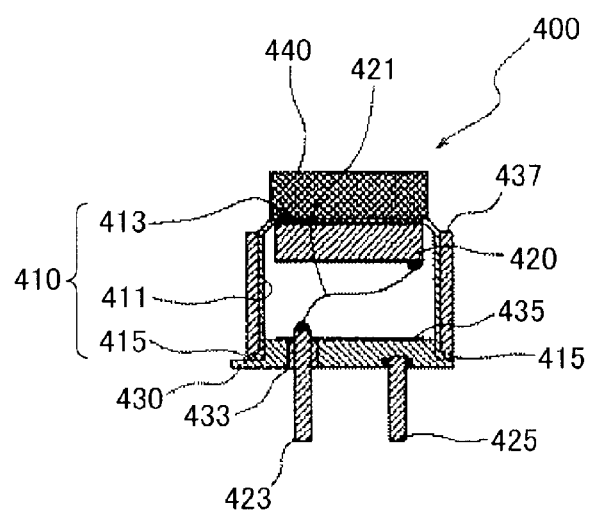
FIG. 6 A vertical cross-sectional view of an ultrasonic sensor according to one aspect of the present invention.

FIG. 6 is a vertical cross-sectional view of an ultrasonic sensor according to one aspect of the present invention. The ultrasonic sensor 400 includes a metallic case main body 410 and a piezoelectric element 420 embedded in the case main body 410. The case main body 410 has a tubular shape with a bottom and includes a cylindrical tube portion 411, a bottom portion 413 to close one open end of the tube portion 411, and a flange portion 415 provided to the other open end, which is opposite to the bottom portion 413, of the tube portion 411 and extending in a radial direction of the tube portion 411.

The piezoelectric element 420 has a disk shape and has its one flat surface fixed to the inner surface of the bottom portion 413 of the case main body 410. In addition, the piezoelectric element 420 includes electrodes on its both surfaces, and one of the electrodes is connected to the case main body 410 while the other electrode is electrically connected to a first terminal 423 via a twisted wire 421.

A plate-like metallic base 430 is provided at the open end on the side of the flange portion 415 to close the case main body 410. The first terminal 423 is inserted into a hole provided to the base 430 and fixed thereto in the state of being electrically insulated from the base 430 via a glass member 433 functioning as an insulating member. In addition, a second terminal 425 is fixed to the base 430.

An insulating label 435 arranged to cover the inner surface of the base 430, being surrounded by the case main body 410, is provided on the inner surface of the base 430 that is opposed to the bottom portion 413 of the case main body 410. In addition, on the outer surface of the case main body 410, a resin cover 437 is wound around the lateral surface of the case main body 410 so as to cover the lateral surface of the tube portion 411 of the case main body 410. In addition, an acoustic adjustment member 440 is fixed to the outer surface of the bottom portion 413 of the case main body 410, the outer surface being on the opposite side to the inner surface of the bottom portion 413 where the piezoelectric element 420 is disposed. It is to be noted that the ultrasonic sensor 400 defines an ultrasonic transmitting and receiving device functioning as a sensor to detect ultrasonic waves and an ultrasonic generator to generate ultrasonic waves.

The ultrasonic sensor can perform high-sensitive ultrasonic detection and achieve excellent heat resistance by the use of the piezoelectric element 420 that has excellent piezoelectric properties and shows no abrupt property change between −50° C. and +150° C.

Figure 7:
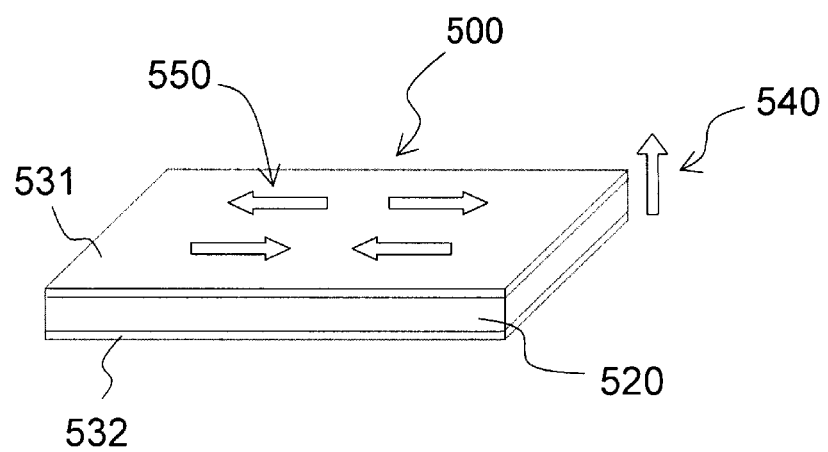
FIG. 7 A perspective view of an actuator according to one aspect of the present invention.

FIG. 7 is a perspective view of an actuator according to one aspect of the present invention. The actuator 500 defines a single-plate piezoelectric oscillator including a piezoelectric element 520 and a pair of electrode layers 531 and 532 sandwiching the piezoelectric element 520 therebetween. When a voltage is placed between the electrode layers 531 and 532 of the actuator 500, the piezoelectric element 520 sandwiched therebetween generates an electric field to displace (expand and contract) the piezoelectric element 520. When the piezoelectric element 520 is polarized in the up/down direction 540 (a thickness direction) in FIG. 7, the expanding and contracting is made in the right/left direction 550 in FIG. 7. Disposing a driven member on the upper surface or the lower surface of the actuator 500 allows the driven member to be driven in accordance with the displacement of the piezoelectric element 520.

The actuator can drive another member in an efficient fashion and achieve excellent heat resistance by the use of the piezoelectric element 520 that has excellent piezoelectric properties and show no abrupt property change between −50° C. and +150° C.

The piezoelectric ceramic composition and the piezoelectric element according to the aspects of the present invention are widely applicable for vibration detection, pressure detection, oscillation, piezoelectric device use, and the like. Examples of the applications of the piezoelectric ceramic composition and the piezoelectric element include a variety of vibration detection sensors (e.g., a knock sensor and a combustion pressure sensor), piezoelectric devices such as a transducer, an actuator, and a filter, and a variety of devices such as a high-voltage generator, a micro power supply device, a variety of driving devices, a position control device, a vibration control device, and a fluid ejection device (e.g., a paint ejection device and a fuel ejection device). The piezoelectric ceramic composition and the piezoelectric element according to the aspects of the present invention are particularly applicable for uses where excellent heat resistance is required (e.g., a knock sensor and a combustion pressure sensor).

EXAMPLES

FIGS. 8A and 8B are views of experimental results on a plurality of sample compositions including examples according to the present invention, the results relating to the influence of the subphase rate on the piezoelectric properties. The influence that subphase rate exert on the piezoelectric properties of the piezoelectric ceramic composition can be evaluated base on the experimental results.

Samples S01 and S02 shown in FIGS. 8A and 8B are comparative examples and include only a first crystal phase. Each of samples S01 and S02 was prepared as follows. $K_2CO_3$ powder, $Na_2CO_3$ powder, $Li_2CO_3$ powder, and $Nb_2O_5$ powder were first weighed out separately such that the quantitative rate among the coefficients a, b, c, and e in the compositional formula of the first crystal phase became the quantitative rate shown in FIG. 8A. Slurry was produced by adding ethanol to these powders and subjecting the powder mixture to wet mixing by a ball mill for 15 hours. Then, the slurry was dried to a mixed powder, and then the resulting mixed powder was formed into a calcined product by calcining in the air at 600° C. to 1100° C. for one to ten hours. A calcined product was then subjected to milling and mixing by a ball mill while a dispersant, a binder, and ethanol were added thereto, and thereby slurry was obtained. Then, the thus-obtained slurry was dried to be granulated, and then was subjected to press working using a uni-axial press under a pressure of 20 MPa to be molded into a disk shape (diameter: 20 mm, thickness: 2 mm). Then, the resulting molded body was subjected to CIP treatment under a pressure of 150 MPa. The thus-obtained CIP-pressed body was then binder-burnout in the air at 1150° C. for seven hours.

Samples S03 to S12 are compositions including both of a first crystal phase and a second crystal phase. The first crystal phases and the second crystal phases of samples S03 to S12 are all same in composition, and different only in subphase rate (vol %). The first crystal phase contains two elements of Ca and Ba as the element C, three elements of Nb, Ti, and Zr as the element D, and two elements of Co and Zn as the element E. The subphase contains two elements of Co and Zn as the element M. The composition of the second crystal phase is $CoZnTiO_4$ as shown in FIG. 8B. It is to be noted that a detailed analysis of the composition of the second crystal phase of sample S06 shows that an accurate composition is $Co_{0.7}Zn_{0.73}TiO_y$. In samples S03 to S12, the subphase rates varies from 0.4 vol % to 5.3 vol %. Each of samples S03 to S12 was prepared through above-described steps T110 to T160 shown in FIG. 1. The samples after the molding in step T150 has a disk shape (diameter: 20 mm, thickness: 2 mm). It is to be noted that the other samples can also be prepared using the above-described process for producing these samples.

Coefficients f1, f2, and f3 in FIG. 8A indicate the respective coefficients of the one to three elements indicated in the column of the element D. Take, for example, sample S01, only the one element of Nb is indicated in the column of the element D, and thus coefficient f1 indicates the coefficient of the element Nb. In addition, take, for example, sample S03, the three elements of Nb, Ti, and Zr are indicated in the column of the element D, and thus coefficient f1 indicates the coefficient of the element Nb that is indicated first in the column of the element D, coefficient f2 indicates the coefficient of the element Ti that is indicated second, and coefficient f3 indicates the coefficient of the element Zr that is indicated third. The relation as described above can be applied also to coefficients g1, g2, and g3 of the element E. The same can be applied also to FIG. 11A, FIG. 12A, FIG. 12B, FIG. 16A, and the like to be described later.

Piezoelectric elements 200 (see FIG. 2) were produced by subjecting these samples S01 to S12 to treatment in steps T170 to T190 shown in FIG. 1. Measurements of the subphase rate, the electrical properties of the piezoelectric ceramic 100 (relative permittivity $\epsilon_{33}^T/\epsilon_0$), the piezoelectric properties (a piezoelectric constant $d_{33}$ and an electromechanical coupling coefficient kr), and presence or absence of a room-temperature phase transition point were performed on each of the obtained piezoelectric elements 200 of the samples. The results are shown in FIG. 8B. The coefficients h of samples S01 and S02 were 3.0 each. The coefficients h of samples S03 to S12 were in the range of 3.0 to 3.1.

Samples S01 and S02 including only the first crystal phase are not greatly different from each other in electrical properties (relative permittivity $\epsilon_{33}^T/\epsilon_0$) and in piezoelectric properties (a piezoelectric constant $d_{33}$ and an electromechanical coupling coefficient kr). However, sample S02 containing Li is preferable to sample S01 containing no Li, as having a slightly higher piezoelectric constant $d_{33}$. This shows that it is preferable that the first crystal phase should contain Li even in the piezoelectric ceramic composition including both of the first crystal phase and the second crystal phase.

Samples S03 to S12 are compositions varying in subphase rate from 0.4 vol % to 5.3 vol %. The first crystal phases and the second crystal phases of samples S03 to S12 are all same in composition. Rietveld Analysis using a diffraction result of X-ray powder diffraction (XRD) was performed on each of samples S03 to S12. As a result, it was fond that the second crystal phases of all S03 to S12 were spinel compounds. To be specific, in Rietveld Analysis of each sample, a reliability factor S indicating whether or not the composition of the second crystal phase is applicable to the structure of a spinel compound that is presumed from the composition of the second crystal phase was 1.5 or less. Thus, it was found that the applications could be made with sufficient confidence.

Figure 9A:
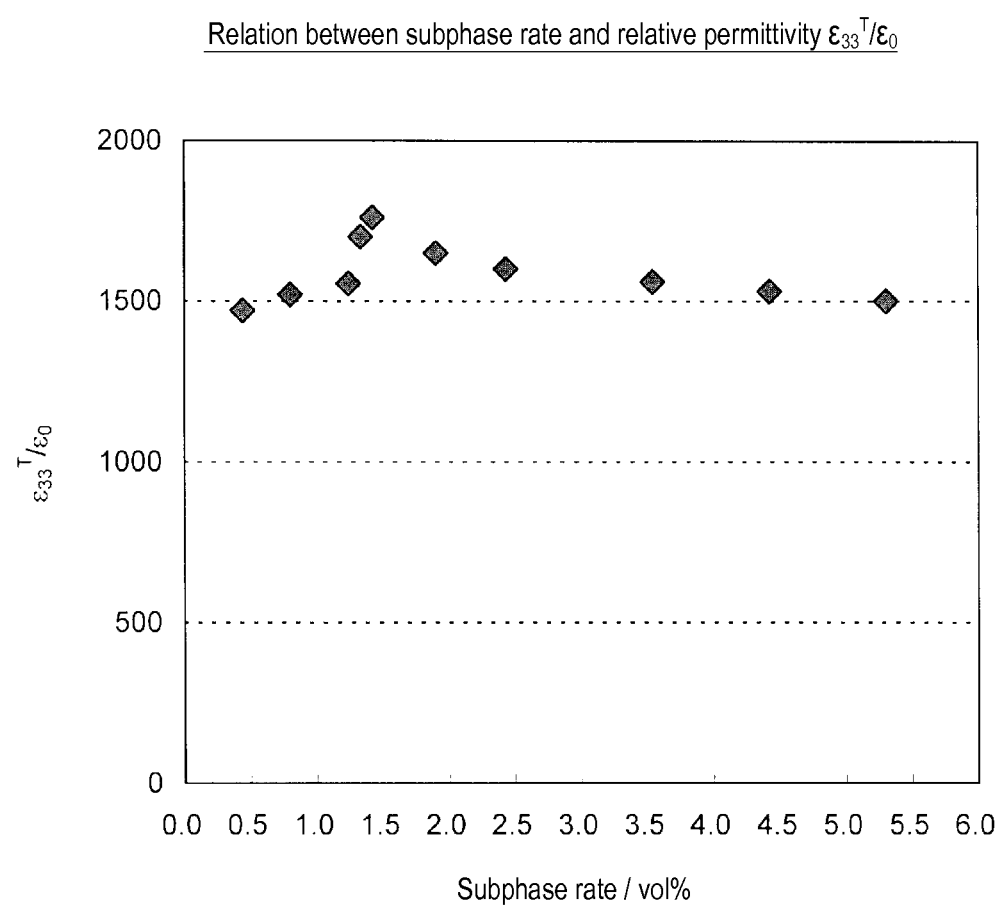
FIG. 9A A graph indicating the relations between subphase rates and relative permittivities $\in_{33}^{T}/\in_0$ of samples S03 to S12.

FIG. 9A is a graph indicating the relations between the subphase rates and the relative permittivities $\epsilon_{33}^T/\epsilon_0$ of samples S03 to S12. As is seen from FIG. 8B, the relative permittivities $\epsilon_{33}{}^T/\epsilon_0$ of samples S03 to S12 are favorable as being sufficiently higher than those of samples S01 and S02 of comparative examples. In addition, as is seen from FIG. 9A, the subphase rates are preferably in the range of 0.4 vol % to 6.0 vol %, more preferably 0.5 vol % to 6.0 vol %, and most preferably 1.3 vol % to 2.0 vol % in terms of relative permittivity $\epsilon_{33}{}^T/\epsilon_0$.

Figure 9B:
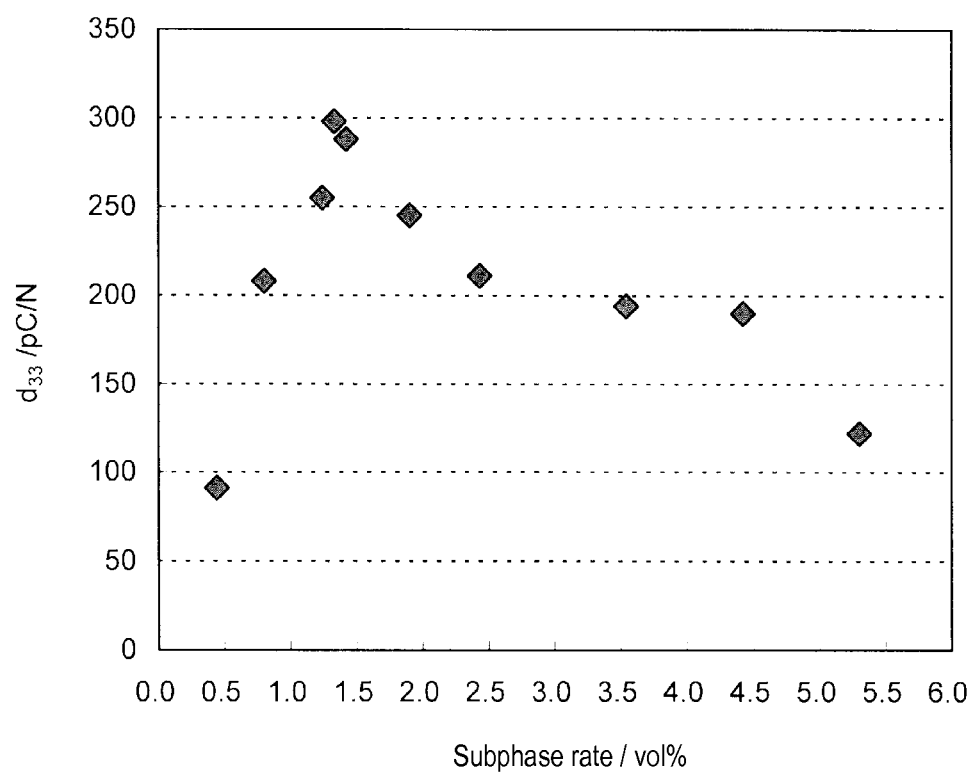
FIG. 9B A graph indicating the relations between subphase rates and piezoelectric constants $d_{33}$ of samples S03 to S12.

FIG. 9B is a graph indicating the relations between the subphase rates and the piezoelectric constants $d_{33}$ of samples S03 to S12. Sample S03 of which the subphase rate is 0.4 vol % has a piezoelectric constant $d_{33}$ approximately equal to those of samples S01 and S02 of comparative examples. While sample S12 of which the subphase rate is 5.3 vol % has a piezoelectric constant $d_{33}$ higher than those of samples S01 and S02 of comparative examples, the increased effect is relatively small. As is seen from FIG. 9B, the subphase rates are preferably in the range of 0.5 vol % to 5.0 vol %, more preferably 0.5 vol % to 2.5 vol %, and most preferably 1.0 vol % to 2.0 vol % in terms of piezoelectric constant $d_{33}$.

Figure 9C:
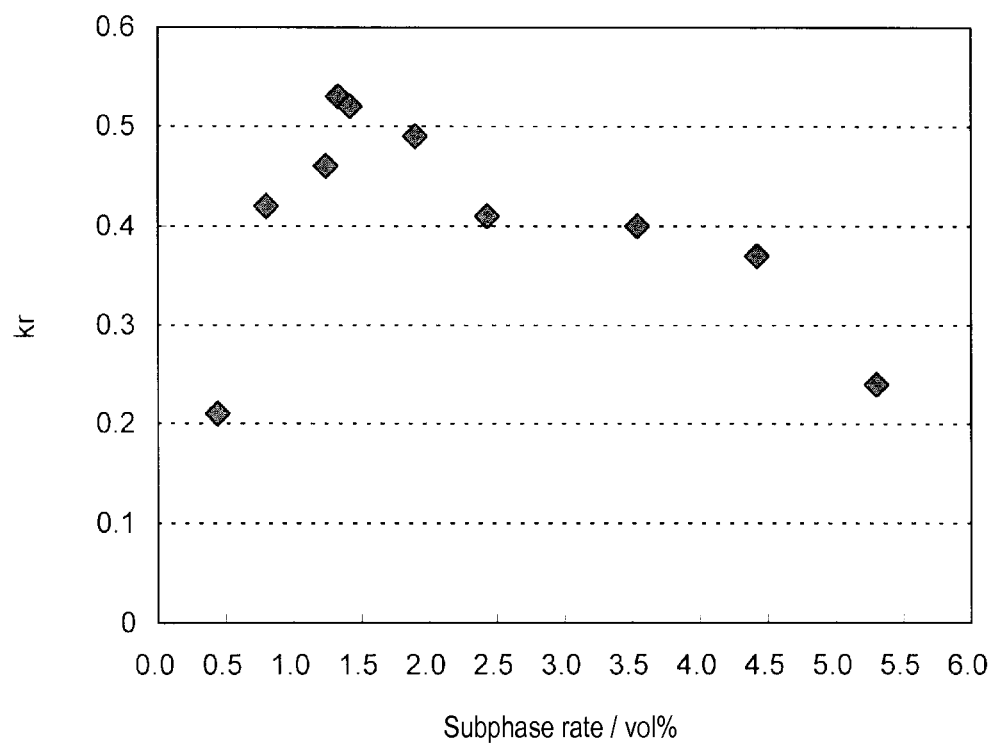
FIG. 9C A graph indicating the relations between subphase rates and electromechanical coupling coefficients kr of samples S03 to S12.

FIG. 9C is a graph indicating the relations between the subphase rates and the electromechanical coupling coefficients kr of samples S03 to S12. Sample S03 of which the subphase rate is 0.4 vol % and sample S12 of which the subphase rate is 5.3 vol % have electromechanical coupling coefficients kr slightly smaller than those of samples S01 and S02 of comparative examples. As is seen from FIG. 9C, the subphase rates are preferably in the range of 0.5 vol % to 5.0 vol %, more preferably 0.5 vol % to 2.5 vol %, and most preferably 1.0 vol % to 2.0 vol % in terms of electromechanical coupling coefficient kr.

For typical example, the properties of special importance as a piezoelectric element are the piezoelectric constant $d_{33}$ and the electromechanical coupling coefficient kr. Thus, the subphase rate of the piezoelectric ceramic composition for use in a piezoelectric element is preferably in the range of 0.5 vol % to 5.0 vol %, more preferably 0.5 vol % to 2.5 vol %, and most preferably 1.0 vol % to 2.0 vol %. However, as to which one is of most importance among three of the relative permittivity $\epsilon_{33}{}^T/\epsilon_0$, the piezoelectric constant $d_{33}$, and the electromechanical coupling coefficient kr differs depending on the use of the ceramic composition. For example, the composition having a high relative permittivity $\epsilon_{33}{}^T/\epsilon_0$ is suitable for use in a condenser. In addition, the composition having a high piezoelectric constant $d_{33}$ is suitable for use in an actuator or a sensor. In addition, the composition having a high electromechanical coupling coefficient kr is suitable for use in a piezoelectric transformer or an actuator. piezoelectric ceramic compositions suitable for a variety of uses are determined according to the properties required of the respective uses.

The results of evaluation tests on presence or absence of a room-temperature phase transition point that were performed on samples S01 to S12 are indicated in the rightmost column of the table shown in FIG. 8B. As the evaluation tests on presence or absence of the phase transition point, measurements were taken of relative permittivity $\epsilon_{33}{}^T/\epsilon_0$ while the environmental temperatures were gradually changed in the range of −50° C. and +150° C. In general, a piezoelectric ceramic composition having a phase transition point in a certain temperature range shows abrupt change such that its relative permittivity $\epsilon_{33}{}^T/\epsilon_0$ has a clear peak depending on a temperature change in the temperature range. On the other hand, a piezoelectric ceramic composition having no phase transition point in the certain temperature range shows no clear peak in the relative permittivity $\epsilon_{33}{}^T/\epsilon_0$ change, and the change is gentle. Thus, determination as to whether or not the phase transition point was clearly observed was made on each of samples S01 to S12 based on the change in relative permittivity $\epsilon_{33}{}^T/\epsilon_0$ that changed when the temperature was gradually changed in the range of −50° C. and +150° C. Based on this determination, it was determined whether or not a "room-temperature phase transition point" is present or absent. It is known that the word "room temperatures" herein means the temperature range wider than a normal room temperature (25° C.).

In samples S01 and S02 of comparative examples, a room-temperature phase transition point was observed. On the other hand, in any of samples S03 to S12, a room-temperature phase transition point was not observed. Presence of a room-temperature phase transition point is not favorable because the electric properties or the piezoelectric properties of piezoelectric ceramic compositions greatly change above and below the room-temperature phase transition point. From this viewpoint, samples S03 to S12 including both of a first crystal phase and a second crystal phase are more favorable than samples S01 and S02 of comparative examples because a room-temperature phase transition point was absent in samples S03 to S12.

Sample S03 had a piezoelectric constant $d_{33}$ and an electromechanical coupling coefficient kr approximately equal to those of samples S01 and S02 of comparative examples; however, because a room-temperature phase transition point was absent in sample S03, sample S03 is more favorable than samples S01 and S02 of comparative examples, for use where presence or absence of a room-temperature phase transition point is important. Sample S12 had an electromechanical coupling coefficient kr lower than those of samples S01 and S02 of comparative examples; however, a room-temperature phase transition point was absent in sample S12, and the piezoelectric constant $d_{33}$ of sample S12 was higher than those of samples S01 and S02. Thus, sample S12 is also more favorable than samples S01 and S02 in use where presence or absence of a room-temperature phase transition point is important.

FIG. 10 is a view to compare reflected electron images of samples S01 and S06 obtained using EPMA (electron probe microanalyzer). Holes (blackish areas) are observed in addition to an area of a first crystal phase (a gray area) in the electron image of sample S01. That is, there exist quite a lot of holes in the first crystal phase in sample S01 of comparative example. It is assumed that these holes are clearances created among a number of fine crystal grains that form the first crystal phase. On the other hand, holes are very few while areas of a second crystal phase (areas with a color density of halftone between the holes and the first crystal phase) are observed instead of the holes in the electron image of sample S06. It is known that the holes are filled with the second crystal phases in sample S06, so that there exist few holes.

As described above, the crystal grains of the first crystal phase are bonded together by the second crystal phase in the piezoelectric ceramic composition where the holes formed in the first crystal phase are filled with the second crystal phase. It is assumed that the piezoelectric constant $d_{33}$ and the electromechanical coupling coefficient kr become extremely high by the above-described result. As is seen from FIG. 8B, the piezoelectric constants $d_{33}$ and the electromechanical coupling coefficients kr are highest in samples S06 and S07 having a subphase rate of 1.3 to 1.5 vol %. It is assumed that because during the time when the subphase rate increases up to 1.3 to 1.5 vol %, a filling rate of the holes in the first crystal phase gradually increases with the subphase rate, the piezoelectric constant $d_{33}$ and the electromechanical coupling coefficient kr gradually increase. On the other hand, it is assumed that when the subphase rate increases further over 1.3 to 1.5 vol %, the rate of the first crystal phase having piezoelectric properties is reduced, so that the piezoelectric constant $d_{33}$ and the electromechanical coupling coefficient kr gradually decrease.

The subphase rates (vol %) of samples S03 to S12 shown in FIGS. 8A and 8B were measured using these reflected electron images as follows. First, a sintered body of each sample was mirror polished to be subjected to conductive treatment. Then, reflected electron images of the samples were taken at a 1000-fold magnification using an electron probe microanalyzer (EPMA). At this time, reflected electron images at ten sites were taken for each sample. The thus-obtained reflected electron images were expressed with an eight-step gradation to be grouped into three areas of the first crystal phases, the second crystal phases, and holes according to gradation. Then, the area rates of the second crystal phases were measured using image analysis software. The average value of the area rates of the second crystal phases in eight images excluding an image having the largest area rate of the second crystal phase and an image having a smallest area rate of the second crystal phase was used as the area rate of the second crystal phase for each sample. The thus-obtained area rate of the second crystal phase was used as a volume rate of the second crystal phase (subphase rate). In the present aspect, WinROOF produced by MITANI CORPORATION was used as an image-editing software. The rate of a third crystal phase when the subphase includes the third crystal phase can be also measured in a similar manner. It is to be noted that the element rate of each crystal phase was measured using an EMPA-WDS (wave-length-dispersive X-ray spectrometer) and an EMPA-EDS (energy-dispersive X-ray spectrometer).

FIGS. 11A and 11A are views of experimental results relating to the influence of the type of a metallic element M of a subphase on the properties of a piezoelectric ceramic composition. The properties of sample S06 shown in FIGS. 8A and 8B are put again in the uppermost rows of the tables shown in FIGS. 11A and 11B. In samples S13 to S23, the elements M in the second crystal phases are different from one another. The compositions of the second crystal phases are shown in FIG. 11B. It was determined that the second crystal phases in samples S06, S13 to S22 shown in FIG. 11B were spinel compounds; however, the second crystal phase in sample S23 shown in FIG. 11B was not a spinel compound but a perovskite phase. It is to be noted that a detailed analysis of the composition of the second crystal phase of sample S13 showed that an accurate composition was $Co_{2.03}TiO_y$.

Concerning samples S06, S13 to S23, measurements were taken of relative permittivity $\in_{33}^{T}/\in_0$, dielectric loss tan δ, piezoelectric constant $d_{33}$, electromechanical coupling coefficient kr, kt, mechanical quality factor Qm, and Curie point Tc as shown in FIG. 11B. Sample S23 of comparative example had inferior properties in relative permittivity $\in_{33}^{T}/\in_0$, dielectric loss tan δ, piezoelectric constant $d_{33}$, and electromechanical coupling coefficient kr, kt to samples S06, S13 to S22.

FIGS. 12A to 12D are views of experimental results relating to the influence of the type of a metallic element M of a subphase on the properties of a piezoelectric ceramic composition (No. 2). Because there are many samples to compare, the compositions of the main phases (first crystal phases) are shown in FIGS. 12A and 12B while the compositions of the subphases (second crystal phases and third crystal phases) and the properties of the piezoelectric ceramic compositions are shown in FIGS. 12C and 12D. Samples S100 to S131 can be divided into the following groups according to the compositions.

<Group 1> S100 to S114: a sample group of which the element D of the first crystal phase consists of Nb, Ti, and Zr, and the element M of the second group consists of two or three metallic elements. However, sample S107 contains Hf instead of Zr as the element D of the first crystal phase.

<Group 2> S114 to S117: a sample group of which the element D of the first crystal phase consists of Co and Fe, and the element M of the second group also consists of Co and Fe. It is to be noted that S114 is included both in the group 1 and group 2. Samples S114 and S115 are different from each other in value of the coefficients a to d in the compositions of the first crystal phases. Sample S116 is different from the other samples S114, S115, and S117 in containing Ta as the element D of the first crystal phase. Sample S117 is different from the other samples S114, S115, and S116 in containing Sr as the element C of the first crystal phase.

<Group 3> S118 to S120: a sample group of which the element D of the first crystal phase consists of any one of Sn, Sb, and Si in addition to Nb, Ti, and Zr, and the element M of the second group consists of any one of Sn, Sb, and Si in addition to Zn.

<Group 4> S121 to S126: a sample group of which the element D of the first crystal phase consists of Nb, Ti, and Zr, the element E of the first crystal phase consists of any one of Fe, Ni, Mg, Zn, Mn, and Co, and the element M of the second group also consists of any one of Fe, Ni, Mg, Zn, Mn, and Co.

<Group 5> S127 to S131: a sample group of which the element D of the first crystal phase consists of Nb, Ti, and Zr, the element E of the first crystal phase consists of Fe, Zn, and Co, and the element M of the second group also consists of Fe, Zn, and Co. It is to be noted that a detailed analysis of the composition of the second crystal phase of sample S131 showed that an accurate composition was $Mg_{1.1}Fe_{1.55}TiO_y$.

A plurality of samples (samples S100, S106, S107, S109, S112, S121, S122, S124, S125, S127 to S131) among samples S100 to S131 include a third crystal phase as shown in FIGS. 12C and 12d. These third crystal phases were precipitated as a result of production of piezoelectric ceramic compositions, which were produced according to the compositions of the first crystal phases and the second crystal phases shown in FIGS. 12A and 12B following the steps shown in FIG. 1. The volume rates of the third crystal phases are 0.3% or less in the entire piezoelectric ceramic compositions and are thus very small as shown in FIGS. 12C and 12D. Thus, the changes in the compositions of the first crystal phases and the second crystal phases made by precipitation of the third crystal phases present no practical problem.

The following is known by comparing FIGS. 12C and 12D.

(1) Each of samples S100 to S102, S105 to S120, S127 to S131 of which element M of the second crystal phase consists of two or more metallic elements has more favorable piezoelectric properties (especially in piezoelectric constant $d_{33}$ and electromechanical coupling coefficient kr), compared with samples S121 to S126 of which the element M of the second group consists of one metallic element. In particular, compared with samples S121 to S126 of which the element M of the second group consists of one metallic element, samples S103 and S104 of which the element M of the second group consists of two or more metallic elements and that uses Mn (manganese) as the element M are more favorable in terms of increasing mechanical quality factor Qm while obtaining piezoelectric properties equal to those of samples S121 to S126.

(2) Sample S107 using Hf as the element D of the first crystal phase also has piezoelectric properties approximately equal to those of samples S100 to S106 and S108 to S114 that uses Zr instead of Hf.

(3) While sample S116 using Ta as the element D of the first crystal phase also has favorable piezoelectric properties, each of samples S114 and S115 using Zr instead of Ta has more favorable piezoelectric properties.

(4) Each of sample S117 using Sr as the element C of the first crystal phase also has piezoelectric properties approximately equal to those of samples S114 and S115 that uses Ba instead of Sr.

(5) Each of samples S118 to S120 of which the element D of the first crystal phase consists of any one of Sn, Sb, and Si also has relatively favorable piezoelectric properties.

(6) Each of samples S100, S106, S107, S109, S112, S121, S122, S124, S125, and S127 to S131 of which subphase includes the third crystal phase containing an $A_3B_5O_{15}$ type compound also has favorable piezoelectric properties. It is to be noted that as described above, these third crystal phases were precipitated as a result of production of piezoelectric ceramic compositions, which were produced according to the compositions of the first crystal phases and the second crystal phases shown in FIGS. 12A and 12B following the steps shown in FIG. 1. However, in producing the piezoelectric ceramic composition of which the subphase includes the third crystal phase, the raw material of the third crystal phase may be intentionally mixed with the raw material of the subphase.

FIG. 13 is a view of experimental results relating to the influence of a subphase rate on insulation properties of a piezoelectric ceramic composition. Shown herein is the results of presence or absence of breakage in samples S01, S03, S04, and S08 described in FIGS. 8A and 8B at the time when a direct voltage (direct electric field) was placed thereto. It is to be noted that the piezoelectric constants $d_{33}$ are same values as those shown in FIG. 8B. "Polarization conditions" include environmental temperatures and direct electric fields in FIG. 13. Values of 7 kV/mm (25° C. and 40° C.) and 9 kV/mm (80° C.) were used as the direct electric fields. The application time of the field was 30 minutes each. After maintained for 30 minutes under these polarization conditions, the samples of which piezoelectric elements were broken were indicated with letters "NG" while those not broken were indicated with letters "OK". It is to be noted that the placed direct electric fields can be considered to indicate insulation properties of the piezoelectric ceramic compositions.

Sample S01 that includes no second crystal phase had its piezoelectric element broken under any of the three polarization conditions. On the other hand, it was found that sample S03 that includes 0.4 vol % of second crystal phase had its piezoelectric element not broken under the polarization condition of 7 kV/mm (25° C. and 40° C.), but broken under the polarization condition of 9 kV/mm (80° C.). It was found that sample S06 that includes 1.3 vol % of second crystal phase and sample S08 that includes 1.9 vol % of second crystal phase had its piezoelectric element not broken under any of the polarization conditions. Seeing these experimental results, it can be known that the piezoelectric ceramic compositions including the second crystal phases that are spinel compounds have favorable insulation properties. Note that it is preferable that the subphase rate should be 0.5 vol % or more, and more preferable that the subphase rate should have 1.3 vol % or more in terms of insulation properties.

FIG. 14 is a view of experimental results on high-temperature endurance. Shown herein are changes in piezoelectric constant $d_{33}$ of sample S01 of comparative example described in FIGS. 8A and 8B and sample S22 described in FIGS. 11A and 11B after being subjected to a thermal aging processing. The thermal aging processing was performed at 200° C. for ten hours. In sample S01 of comparative example, the piezoelectric constant $d_{33}$ decreased by 33.3% by the thermal aging processing. Meanwhile, in sample S22, the piezoelectric constant $d_{33}$ decreased only by 3.6% by the thermal aging processing and thus the decreasing rate is very small. Thus, the piezoelectric ceramic composition including the second crystal phase of the spinel compound is excellent also in high-temperature endurance.

FIG. 15 is a view of a result of a thermal cycle test. Shown in FIG. 15 are changes in piezoelectric constant $d_{33}$ of sample S02 of comparative example described in FIGS. 8A and 8B and samples S129 to S131 described in FIGS. 12A to 12D after a thermal cycle test was performed thereon. The thermal cycle test was performed in the following procedure.
(i) The piezoelectric element was placed in a thermostatic chamber, and the piezoelectric properties of the piezoelectric element were evaluated (an initial value).
(ii) Then, a thermal cycle of changing the temperature between −50° C. and +150° C. at a temperature change rate of 2° C./min. was repeated 1000 times (the holding times at −50° C. and at +150° C. were one hour each).
(iii) Then, the piezoelectric properties at room temperature were evaluated again (a property value after the thermal cycle).

In sample S02 of comparative example, the piezoelectric constant $d_{33}$ decreased by 66% by the thermal cycle test. Meanwhile, in samples S129 to S131, the piezoelectric constant $d_{33}$ decreased only by 1 to 4% by the thermal cycle test and thus the decreasing rate is very small. Thus, the piezoelectric ceramic composition including the second crystal phase of the spinel compound is excellent also in endurance in thermal cycle.

FIGS. 16A and 16B are views of experimental results relating to the influence of the coefficient e in compositional formula of a first crystal phase on properties of the piezoelectric ceramic composition. Sample S01 is same as sample S01 shown in FIGS. 8A and 8B. Samples S24 to S31 are different from one another in coefficient e (the number of the alkali element for the A-site) among the coefficients a to h in the compositional formulae of the first crystal phases, and the other coefficients are constant among Samples S24 to S31. It is to be noted that sample S28 is same as sample S13 shown in FIG. 11. The alkali earth metal contained in each first crystal phase (the element C in the compositional formula) consists of two metals of Ca and Ba. In addition, samples S24 to S31 are common in that the element D consists of three elements of Nb, Ti, and Zr, and the element E consists of one element of Co among the elements for the B-site. In addition, samples S24 to S31 are common in that the compositions of the second crystal phases are $Co_2TiO_4$, and the subphase rates are 1.4 vol %.

The relative permittivities $\in_{33}^T/\in_0$ of samples S24 to S31 are favorable as being sufficiently higher than that of sample S01 of comparative example. The value of the coefficient e in the compositional formula of first crystal phase preferably satisfies $0.80 \leq e \leq 1.10$, and more preferably $0.88 \leq e \leq 1.10$ in terms of relative permittivities $\in_{33}^T/\in_0$.

Figure 17:
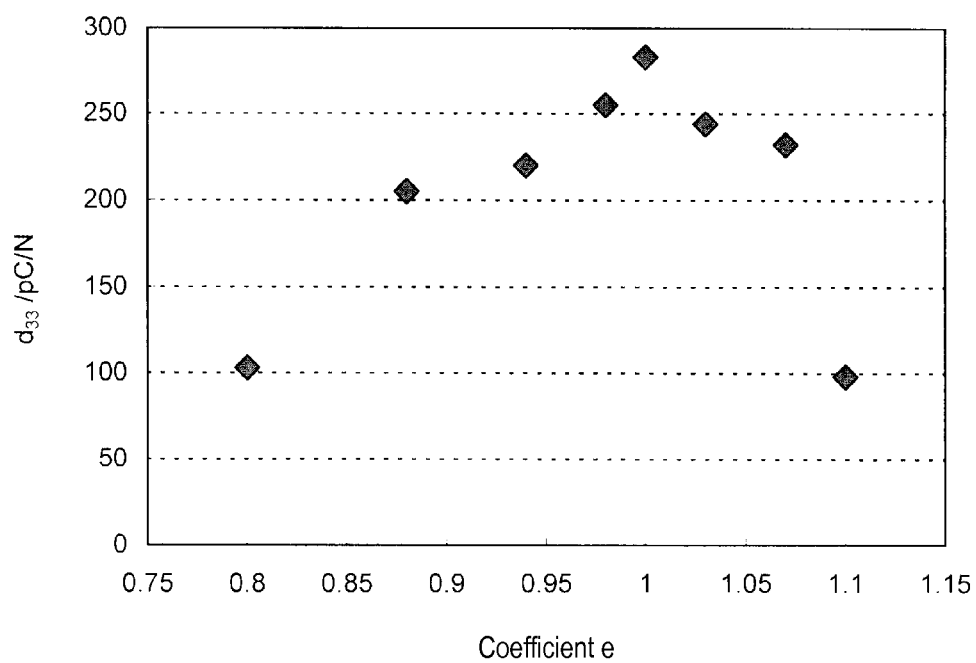
FIG. 17 A graph indicating the relation between coefficients e in compositional formulae of first crystal phases and piezoelectric constants $d_{33}$.

FIG. 17 is a graph indicating the values of the piezoelectric constants $d_{33}$ of the samples S24 to S31. The horizontal axis indicates the value of the coefficient e in the compositional formula of the first crystal phase. The value of the coefficient e in the compositional formula of the first crystal phase preferably satisfies 0.84≤e≤1.08, more preferably 0.88≤e≤1.07, and most preferably 0.98≤e≤1.03 in terms of piezoelectric constant $d_{33}$.

Back to FIG. 16B, concerning the electromechanical coupling coefficients kr, samples S25 to S30 are favorable as having electromechanical coupling coefficients kr sufficiently higher than that of sample S01 of comparative example. The value of the coefficient e in the compositional formula of the first crystal phase preferably satisfies 0.84≤e≤1.08, more preferably 0.88≤e≤1.07, and most preferably 0.98≤e≤1.01 in terms of electromechanical coupling coefficient kr.

The values of special importance as a piezoelectric element are the piezoelectric constant $d_{33}$ and the electromechanical coupling coefficient kr. Thus, the value of the coefficient e preferably satisfies 0.88≤e≤1.07, more preferably 0.98≤e≤1.03, and most preferably 0.98≤e≤1.01 in terms of use as a piezoelectric element.

Modification

It is to be noted that the present invention is not limited to the examples and aspects described above, and may be embodied in various modifications without departing from the spirit and scope of the invention. For example, the piezoelectric ceramic compositions in the above-described examples may include another subphase than the second crystal phase as long as the piezoelectric properties are not influenced, and the piezoelectric ceramic compositions show no abrupt property change between −50° C. and +150° C. Examples of the another subphase include a crystal phase containing an A-Ti—B—O composition oxide (where the element A is an alkali metal, the element B is at least one of Nb and Ta, and none of the contents of the element A, the element B, and Ti is zero), to be specific, a crystal phase represented by $K_{1-x}TiNb_{1+x}O_5$ (0≤x≤0.15).

DESCRIPTION OF REFERENCE NUMERALS AND SIGNS

1 . . . Knock sensor
2 . . . Metal shell
2a . . . Through-hole
2b . . . Cylinder body
2c . . . Bearing surface
2d . . . Threads
2e . . . Groove
3 . . . Insulating sleeve
4 . . . Insulating plate
5 . . . Insulating plate
6 . . . Piezoelectric element
6a, 6b . . . Sheet electrodes
6c . . . Piezoelectric ceramic
7 . . . Property-adjusting weight
8 . . . Washer
9 . . . Nut
10 . . . Housing
20 . . . Ultrasonic transducer
22 . . . Piezoelectric element pair
23a and 23b . . . Piezoelectric elements
24a, 24b . . . Electrode plates
25 . . . Front plate
26 . . . Backing plate
27 . . . Center bolt
28, 29 . . . Conic portions
30 . . . Ultrasonic radiation surface
31 . . . Blind end hole
40 . . . Cutting tool
42 . . . Spindle
43 . . . Piezoelectric element
44 . . . Fixing jig
45 . . . Grinding portion
46 . . . Base portion
47 . . . Radial direction
48 . . . Rotation direction
100 . . . Piezoelectric ceramic
200 . . . Piezoelectric element
301 . . . Electrode
400 . . . Ultrasonic sensor
410 . . . Case main body
411 . . . Cylindrical tube portion
413 . . . Bottom portion
415 . . . Flange portion
420 . . . Piezoelectric element
421 . . . Twisted wire
423 . . . First terminal
425 . . . Second terminal
430 . . . Base
433 . . . Glass member
435 . . . Insulating label
437 . . . Resin cover
440 . . . Acoustic adjustment member
500 . . . Actuator
520 . . . Piezoelectric element
531 . . . Electrode layer
540 . . . Up/down direction
550 . . . Right/left direction

The invention claimed is:

1. A lead-free piezoelectric ceramic composition, comprising:
   a main phase comprising a first crystal phase comprising an alkali niobate/tantalate type perovskite oxide having piezoelectric properties; and
   a subphase comprising a second crystal phase comprising an M-Ti—O spinel compound (where the element M is a monovalent to quadrivalent element).

2. The lead-free piezoelectric ceramic composition according to claim 1,
   wherein the element M comprises at least one metallic element selected from the group consisting of Li, Mg, Al, Sc, Cr, Mn, Fe, Co, Ni, Zn, Ga, Y, and Zr.

3. The lead-free piezoelectric ceramic composition according to claim 1,
   wherein the M-Ti—O spinel compound is represented by a compositional formula: $M_xTiO_y$ (where the coefficients x and y are relative values when a content of Ti is taken as 1), and
   wherein the coefficient x satisfies 0.5≤x≤5.0.

4. The lead-free piezoelectric ceramic composition according to claim 3,
   wherein the coefficient y satisfies 2≤y≤8.

5. The lead-free piezoelectric ceramic composition according to claim 1,
   wherein the subphase fills a hole formed in the main phase.

6. The lead-free piezoelectric ceramic composition according to claim 1, wherein the contained rate of the second crystal phase in the lead-free piezoelectric ceramic composition is any one of:
(i) 0.5 vol % to 5.0 vol %;
(ii) 0.5 vol % to 2.5 vol %; and
(iii) 1.0 vol % to 2.0 vol %.

7. The lead-free piezoelectric ceramic composition according to claim 1,
wherein the M-Ti—O spinel compound comprises two or more metallic elements as the element M.

8. The lead-free piezoelectric ceramic composition according to claim 1,
wherein the subphase comprises a third crystal phase in addition to the second crystal phase, the third crystal phase comprising an $A_3B_5O_{15}$ type compound (where the element A is a monovalent to divalent metal, and the element B is a divalent to pentavalent metal).

9. The lead-free piezoelectric ceramic composition according to claim 1,
wherein a volume rate of the second crystal phase is 50% or more when the entire subphase is taken as 100%.

10. The lead-free piezoelectric ceramic composition according to claim 1,
wherein the alkali niobate/tantalate type perovskite oxide of the first crystal phase comprises an alkali earth metal.

11. The lead-free piezoelectric ceramic composition according to claim 10,
wherein the alkali niobate/tantalate type perovskite oxide of the first crystal phase is represented by a compositional formula: $(K_aNa_bLi_cC_d)_e(D_fE_g)O_h$ (where the element C comprises one or more elements selected from the group consisting of Ca, Sr, and Ba, the element D comprises one or more elements selected from the group consisting of Nb, Ta, Ti, Zr, Hf, Sn, Sb, and Si while comprising at least Nb or Ta, and the element E comprises one or more elements selected from the group consisting of Mg, Al, Sc, Mn, Fe, Co, Ni, Zn, Ga, and Y, and where a+b+c+d=1, e is arbitrary, f+g=1, and h is an arbitrary value that forms perovskite).

12. The lead-free piezoelectric ceramic composition according to claim 11,
wherein the coefficient e satisfies $0.88 \leq e \leq 1.07$.

13. The lead-free piezoelectric ceramic composition according to claim 1,
wherein the alkali niobate/tantalate type perovskite oxide comprises an alkali niobate type perovskite oxide.

14. A piezoelectric element, comprising:
a piezoelectric ceramic comprising the lead-free piezoelectric ceramic composition according to claim 1; and
an electrode mounted on the piezoelectric ceramic.

15. A device comprising the piezoelectric element according to claim 14.

16. The device according to claim 15,
wherein the device comprises any one of a knock sensor, an ultrasonic transducer, a cutting tool, an ultrasonic sensor, and an actuator.

17. A process for production of the lead-free piezoelectric ceramic composition according to claim 1, the process comprising:
preparing a first powder by mixing and calcining raw materials of the first crystal phase;
preparing a second powder by mixing and calcining raw materials of the second crystal phase; and
producing the lead-free piezoelectric ceramic composition by mixing the first and second powders, molding the mixed powder material into a green body, and then firing the green body,
wherein the firing comprises sealed firing that is performed by sealing the green body in a closed container.

* * * * *